United States Patent
Lee et al.

(10) Patent No.: US 7,855,123 B2
(45) Date of Patent: Dec. 21, 2010

(54) METHOD OF INTEGRATING AN AIR GAP STRUCTURE WITH A SUBSTRATE

(75) Inventors: Eric M. Lee, Austin, TX (US); Junjun Liu, Austin, TX (US); Dorel I. Toma, Dripping Springs, TX (US)

(73) Assignee: Tokyo Electron Limited, Tokyo (JP)

( * ) Notice: Subject to any disclaimer, the term of this patent is extended or adjusted under 35 U.S.C. 154(b) by 36 days.

(21) Appl. No.: 12/415,022

(22) Filed: Mar. 31, 2009

(65) Prior Publication Data
US 2010/0248443 A1    Sep. 30, 2010

(51) Int. Cl.
*H01L 21/76* (2006.01)
(52) U.S. Cl. .................. 438/422; 257/E21.573
(58) Field of Classification Search .......... 438/422; 257/E21.573
See application file for complete search history.

(56) References Cited

U.S. PATENT DOCUMENTS

| 7,666,754 | B2 * | 2/2010 | Toma et al. ............... 438/422 |
| 2004/0137728 | A1 * | 7/2004 | Gallagher et al. ........... 438/689 |
| 2008/0038934 | A1 * | 2/2008 | Vrtis et al. ............... 438/759 |
| 2009/0087562 | A1 * | 4/2009 | Lee et al. ................ 427/255.6 |

* cited by examiner

*Primary Examiner*—Alexander G Ghyka
*Assistant Examiner*—Seahvosh J Nikmanesh

(57) ABSTRACT

A method for forming an air gap structure on a substrate is described. The method comprises depositing a sacrificial layer on a substrate, forming an adhesion-promoting layer between the sacrificial layer and the substrate, and depositing a capping layer over the sacrificial layer. The sacrificial layer and the capping layer are patterned and metalized. Thereafter, the sacrificial layer is decomposed and removed through the capping layer.

22 Claims, 16 Drawing Sheets

METHOD OF INTEGRATING AN AIR GAP STRUCTURE WITH A SUBSTRATE

CROSS-REFERENCE TO RELATED APPLICATIONS

This application is related to U.S. patent application Ser. No. 11/874,461, entitled "METHOD AND SYSTEM FOR FORMING AN AIR GAP STRUCTURE", filed on Oct. 18, 2007. The entire content of which is herein incorporated by reference in its entirety.

BACKGROUND OF THE INVENTION

1. Field of the Invention

The invention relates to a method for forming an air gap structure on a substrate and, more particularly, to a method for integrating an air gap structure with a substrate.

2. Description of Related Art

As is known to those in the semiconductor art, interconnect delay is a major limiting factor in the drive to improve the speed and performance of integrated circuits (IC). One way to minimize interconnect delay is to reduce inter-connect capacitance by using low dielectric constant (low-k) materials as the insulating dielectric for metal wires in the IC devices. Thus, in recent years, low-k materials have been developed to replace relatively high dielectric constant insulating materials, such as silicon dioxide. In particular, low-k films are being utilized for inter-level and intra-level dielectric layers between metal wires in semiconductor devices.

Additionally, in order to further reduce the dielectric constant of insulating materials, material films are formed with pores, i.e., porous low-k dielectric films. Such low-k films can be deposited by a spin-on dielectric (SOD) method similar to the application of photo-resist, or by chemical vapor deposition (CVD). Thus, the use of low-k materials is readily adaptable to existing semiconductor manufacturing processes. However, low-k films and, more specifically, porous low-k films have suffered integration problems including, but not limited to, poor thermal and mechanical performance, copper migration, damage during pattern etching, etc. As a result, for example, the integration of low-k films and porous low-k films has required the use of capping layers having a higher dielectric constant, as well as the development of techniques to restore the dielectric constant of these films resulting from carbon depletion at exposed surfaces, and other techniques to seal exposed pores in the surface of porous low-k films.

Furthermore, in yet another attempt to reduce the dielectric constant of insulating materials, air-gap structures are contemplated. According to one approach, air-gap structures are formed by depositing a sacrificial material on a substrate and then depositing a bridging material over the sacrificial material. Thereafter, at a later point in the device manufacturing process following metallization and planarization, the sacrificial material is decomposed and removed in order to leave a gap or void in its absence. Conventionally, the sacrificial material is removed using a chemical or thermal process. Thus, the sacrificial material plays the role of template or "void precursor", wherein the void is formed upon decomposition of the sacrificial material by thermal treatment and diffusion of the decomposition products out of the multilayer assembly. Thermally degradable polymers have been a preferred choice for use as a sacrificial material.

However, despite the promise of superior electrical performance by this approach, thermally degradable materials still face formidable challenges including, but not limited to, solvent resistance, thermal stability, and mechanical strength. For example, numerous acids, bases and organic solvents are utilized in IC manufacturing, and the sacrificial materials must retain their original dimensions regardless of the presence of these chemicals. Dissolution of sacrificial materials or swelling should be rigorously controlled or excluded. Additionally, for example, chemical vapor deposition of barrier layers on sacrificial materials is anticipated to take place at a substrate temperature between about 250 degrees C. and about 320 degrees C. Hence, the sacrificial material must be thermally stable in this temperature range.

Additionally yet, for example, the mechanical properties of the sacrificial material, such as hardness and Young's modulus, should be sufficiently high to withstand chemical mechanical planarization (CMP) and flip chip bonding. Furthermore, the adhesion of the sacrificial layer to the underlying materials on the substrate should be sufficient to withstand subsequent forces acting thereon. Further yet, for example, the fraction of residue remaining on the substrate following decomposition of the sacrificial material should be minimized to guarantee proper electrical performance. Even further yet, for example, the sacrificial material should be decomposed under conditions not suitable for curing the bridging material.

SUMMARY OF THE INVENTION

The invention relates to a method for forming an air gap structure on a substrate and, more particularly, to a method for integrating an air gap structure with a substrate.

According to an embodiment, a method for forming an air gap structure on a substrate is described. The method comprises depositing a sacrificial layer on a substrate, forming an adhesion-promoting layer between the sacrificial layer and the substrate, and depositing a capping layer over the sacrificial layer. The sacrificial layer and the capping layer are patterned and metalized. Thereafter, the sacrificial layer is decomposed and removed through the capping layer.

DETAILED DESCRIPTION OF EXEMPLARY EMBODIMENTS

Figure 1A:
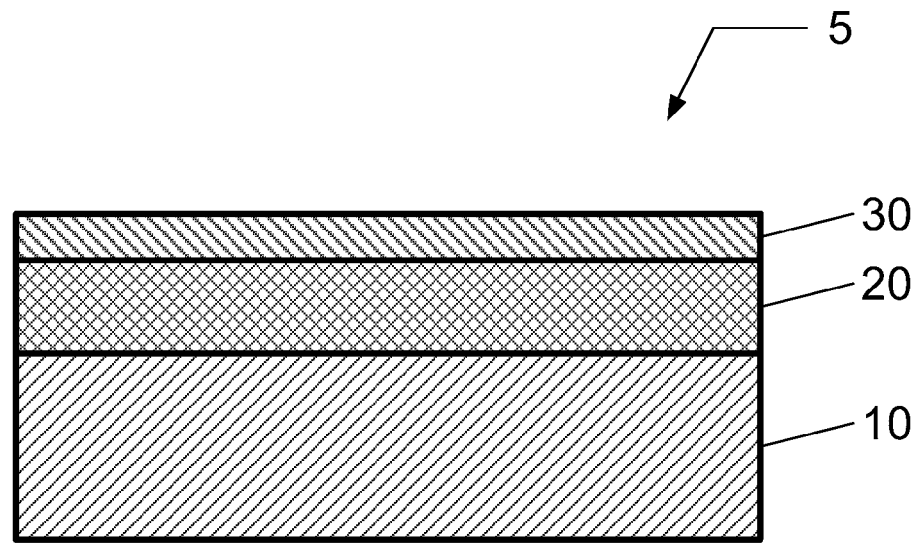
FIGS. 1A through 1E illustrate a method of preparing an air gap structure.

A method for integrating an air gap structure with a substrate is disclosed in various embodiments. However, one skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

"Substrate" as used herein generically refers to the object being processed in accordance with the invention. The substrate may include any material portion or structure of a device, particularly a semiconductor or other electronics device, and may, for example, be a base substrate structure, such as a semiconductor wafer or a layer on or overlying a base substrate structure such as a thin film. Additionally, for example, the substrate may include an interconnect layer or structure, a via level interconnect layer, or a trench level interconnect layer. Thus, substrate is not intended to be limited to any particular base structure, underlying layer or overlying layer, patterned or unpatterned, but rather, is contemplated to include any such layer or base structure, and any combination of layers and/or base structures. The description below may reference particular types of substrate, but this is for illustrative purposes only and not limitation.

As described above, air gap structures are contemplated for further reducing interconnect capacitance and, in turn, reducing interconnect delay and improving the speed and performance of integrated circuits (IC). Therein, a capping layer or bridging material is formed over a sacrificial layer or sacrificial material, and the sacrificial layer or sacrificial material is decomposed and removed in order to leave a gap or void in its absence.

Figure 1B:
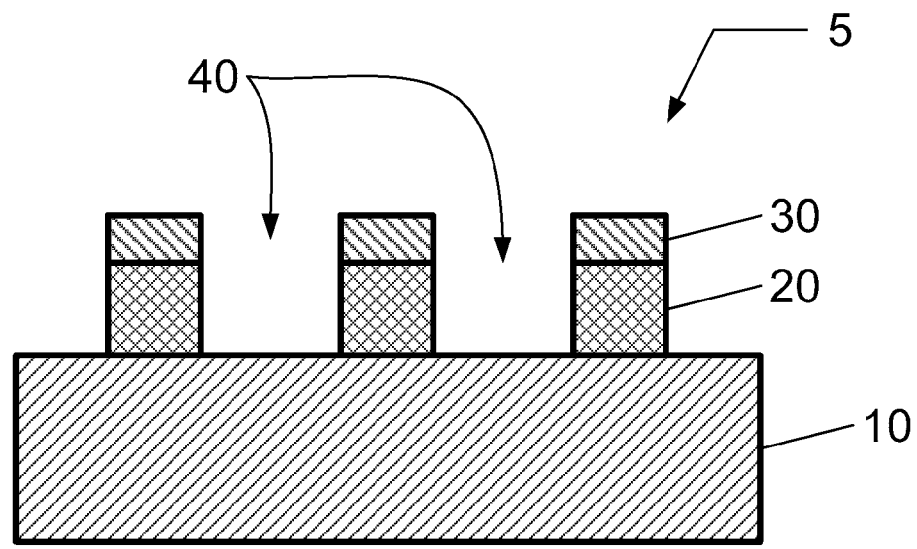

As an example, FIGS. 1A through 1E illustrate a procedure for preparing an air gap structure 5. As shown in FIG. 1A, the procedure comprises forming an inter-level dielectric (ILD) layer 10 on a substrate (not shown). Thereafter, a sacrificial layer 20 is formed on the ILD layer 10, and a capping layer 30 is formed on the sacrificial layer 20. In FIG. 1B, a pattern 40 is transferred to the sacrificial layer 20 and the capping layer 30 using, for instance, a series of lithography and etching processes. The pattern 40 may correspond to a metal line pattern and/or a metal contact pattern to be formed on the ILD layer 10.

Figure 1C:
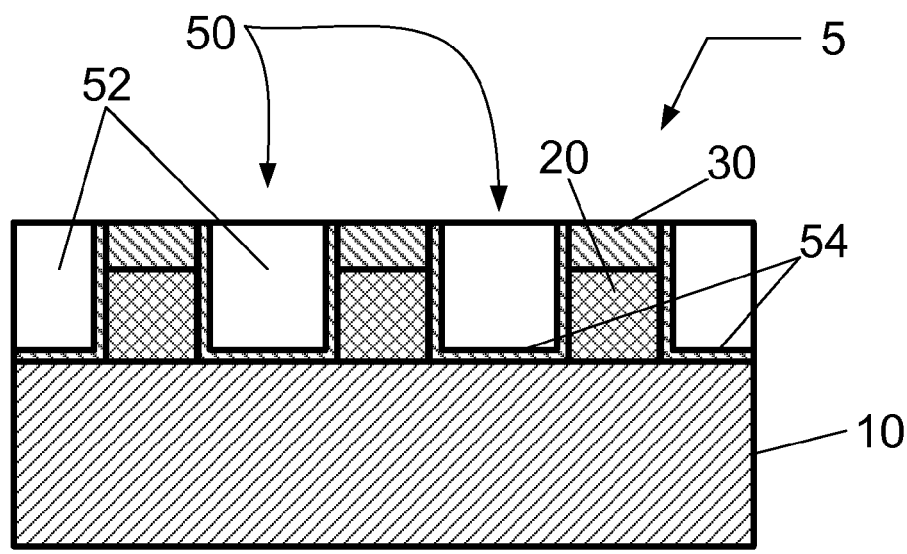

In FIG. 1C, the pattern 40 is metalized to form a metal interconnect 50. The metal interconnect 50 may comprise metal features 52, and a barrier layer 54 disposed between the metal features 52 and the sacrificial layer 20 and the capping layer 30. For instance, the barrier layer 54 may reduce migration of the metal from metal features 52 to the sacrificial layer 20 and the capping layer 30. The metallization of pattern 40 may comprise a series of deposition processes, and a planarization or polishing process.

Figure 1D:
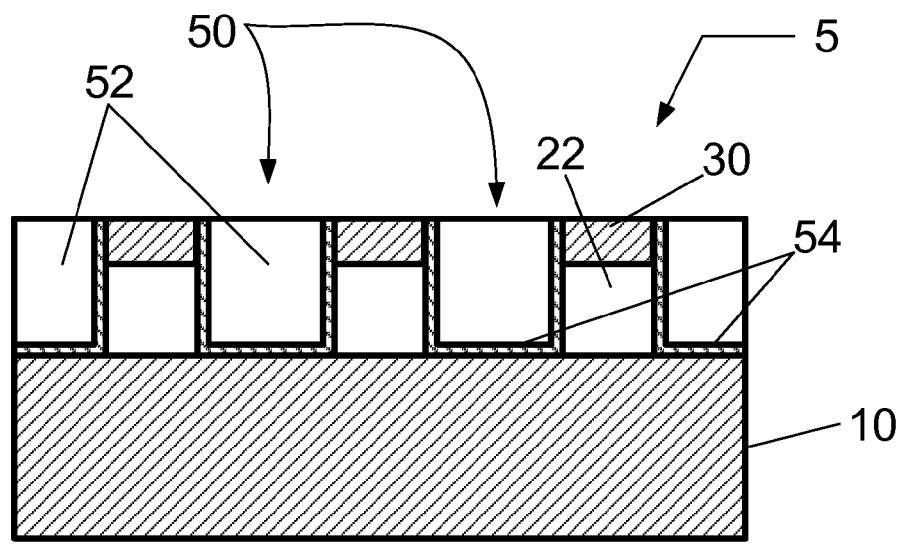
Figure 1E:
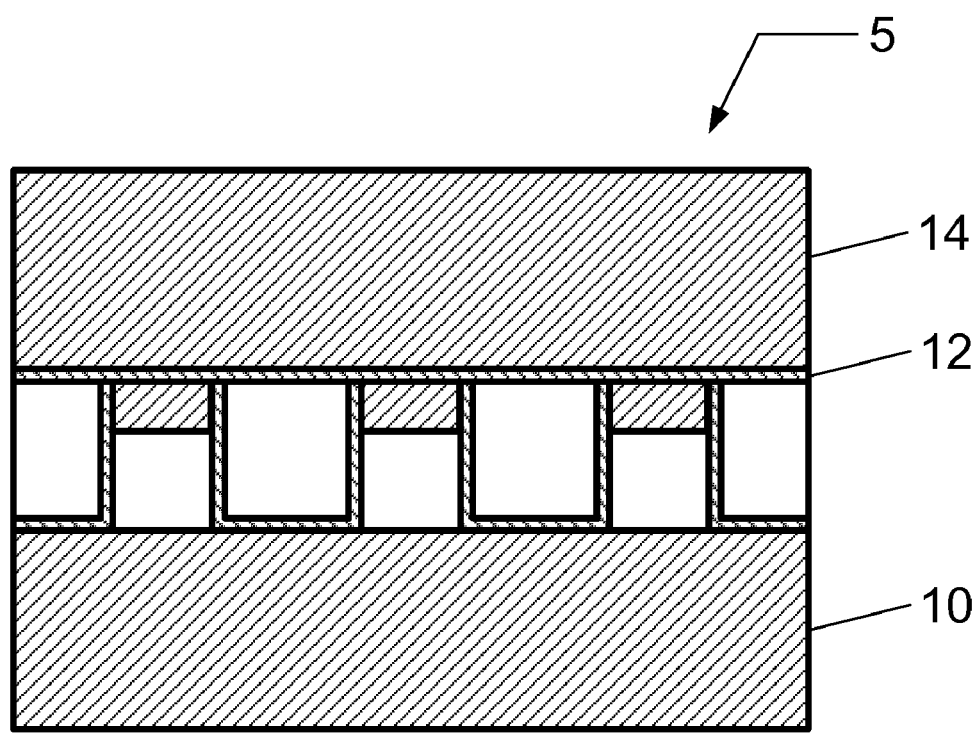

In FIG. 1D, the sacrificial layer 20 is decomposed and removed from air gap structure 5 to leave air gaps 22. Thereafter, as shown in FIG. 1E, a metal cap layer 12 may be formed and a second ILD layer 14 may be formed on the metal cap layer 12.

The sacrificial layer 20 may be formed using a vapor deposition process, such as a chemical vapor deposition (CVD) process, a plasma enhanced CVD process, an initiated CVD process (iCVD) as described in greater detail below, or a filament-assisted CVD process as further described below. Other processes may include a pyrolytic CVD process or a hot-filament CVD (HFCVD) process.

The sacrificial layer 20 may comprise an organic film, a polymer film, a homopolymer film, or a copolymer film. For example, one candidate for the sacrificial layer 20 is a polymer and, more particularly, a cross-linked polymer or cross-linked organic glass. Cross-linked polymers generally possess, among other things, higher chemical resistance, increased thermal stability, and superior mechanical properties when compared to their linear counterparts due to their rigid structure and the substantially lower mobility of polymer backbones.

Two strategies exist for synthesis of cross-linked polymers. One strategy involves simultaneous introduction of two monomers, wherein at least one monomer is multifunctional, followed by the copolymerization of the two monomer species. The other strategy involves polymerization of a single monomer with functional side groups, followed by reaction of the single monomer with externally supplied chemical species or exposure of the single monomer to an energy source so that cross-linking occurs. One requirement for use of the sacrificial layer 20 in an air gap structure may include relatively clean decomposition of the sacrificial layer 20, wherein only a minimal amount of residue remains on the substrate. Other requirements may include the onset temperature for polymer decomposition, monomer reactivity, and monomer volatility.

The capping layer 30 may be formed using a vapor deposition process, such as a chemical vapor deposition (CVD) process, a plasma enhanced CVD process, an initiated CVD process (iCVD), or a filament-assisted CVD process as further described below. Other processes may include a pyrolytic CVD process or a hot-filament CVD (HFCVD) process.

The capping layer 30 may comprise a non-porous layer, a porous layer, or a hybrid porous/non-porous layer or multi-layer. The capping layer 30 may comprise a Si-containing material.

Figure 2:
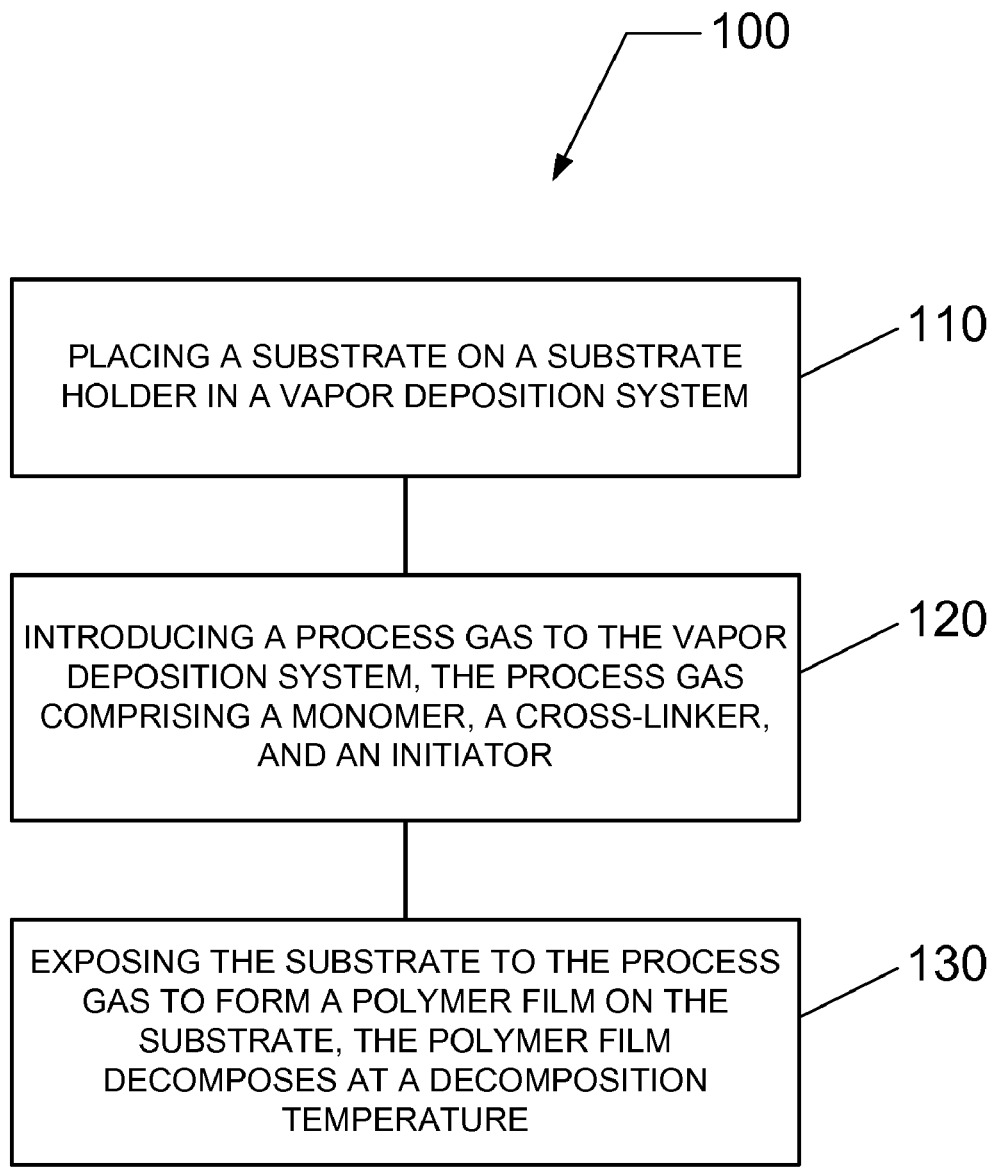
FIG. 2 is a flow chart of a method of depositing a sacrificial layer and/or capping layer on a substrate according to an embodiment.

According to an embodiment, a method of depositing a sacrificial layer and/or capping layer on a surface of a substrate is described. For example, the sacrificial layer and/or capping layer may be utilized in connection with an air gap structure as depicted in FIGS. 1A through 1E. As shown in FIG. 2, the method comprises a flow chart 100 beginning in 110 with placing a substrate on a substrate holder in a vapor deposition system configured for an initiated CVD process. The substrate comprises a surface upon which the sacrificial layer and/or capping layer is deposited.

In 120, a process gas is introduced to the vapor deposition system, wherein the process gas comprises a monomer, a cross-linking monomer (or cross-linker), and an initiator. The process gas may include additional monomers, additional cross-linking monomers, or additional initiators, or any combination of two or more thereof. Thereafter, in 130, the method comprises exposing the substrate to the process gas in order to form the sacrificial layer on the substrate, wherein the sacrificial layer thermally decomposes at a decomposition temperature (onset temperature for degradation).

For example, the sacrificial layer may comprise a polymer film, a homopolymer film, or a copolymer film. Additionally, for example, the sacrificial layer may comprise a methacrylate organic glass. Additionally, for example, the sacrificial layer may comprise a cyclopentyl methacrylate organic glass or a neopentyl methacrylate organic glass.

The one or more monomers can comprise a methacrylate. Additionally, the one or more monomers can comprise a polymethacrylate. Furthermore, the one or more monomers may comprise trimethylsilylmethyl methacrylate (TMMA), propargyl methacrylate (PMA), cyclopentyl methacrylate (CPMA), neopentyl methacrylate (npMA), or poly (neopentyl methacrylate) (P(npMA)), or any combination of two or more thereof.

Additionally, the one or more cross-linking monomers can comprise a difunctional acrylate or a methacrylate. The one or more cross-linking monomers can comprise ethylene glycol diacrylate (EGDA), ethylene glycol dimethacrylate (EGDMA), 1,3-propanediol diacrylate (PDDA), or 1,3-propanediol dimethacrylate (PDDMA), or any combination of two or more thereof.

Furthermore, the one or more initiators can comprise a peroxide, an organic peroxide, a hydroperoxide, or a diazine, or any combination of two or more thereof. For example, the one or more initiators may comprise tert-butyl peroxide (TBPO).

The monomer, the cross-linking monomer, and the initiator may be heated in a vacuum system at moderate temperatures, and the vapors of the monomer, the cross-linking monomer, and the initiator are introduced to the vapor deposition system. The temperature for heating the monomer or the cross-linking monomer or both may be selected to avoid or reduce thermally-induced bulk polymerization. For example, the temperature for heating the monomer may be less than or equal to about 100 degrees C. Additionally, for example, the temperature for heating the cross-linking monomer may be less than or equal to about 100 degrees C. Additionally, the vapor deposition system may be temperature-controlled to avoid or reduce condensation of the vaporized monomer, or the vaporized cross-linking monomer, or both.

The vapors of the monomer, the cross-linking monomer, and the initiator may or may not be fully mixed prior to introduction to the vapor deposition system. For example, the vapors of the monomer, the cross-linking monomer, and the initiator may be partly mixed prior to introduction to the vapor deposition system. Alternatively, for example, the vapors of the monomer, the cross-linking monomer, and the initiator may be introduced to the vapor deposition system independent of one another without any prior mixing.

The method of forming the sacrificial layer may further comprise introducing the monomer at a first flow rate, introducing the cross-linking monomer at a second flow rate, and introducing the initiator at a third flow rate. Additionally, the method may comprise setting a pressure in the vapor deposition system, and controlling the temperature of the substrate or substrate holder or both. For example, the temperature of the substrate may be controlled using the substrate holder.

For example, the first flow rate may range from about 1 sccm (standard cubic centimeters per minute) to about 10 sccm, the second flow rate may range from about 0.1 sccm to about 1 sccm, the third flow rate may range from about 0.1 sccm to about 2 sccm, the pressure may range from about 1 mTorr (millitorr) to about 10 Torr, and the temperature of the substrate may range from about 20 degrees C. to about 100 degrees C. Additionally, for example, the first flow rate may range from about 1.35 sccm (standard cubic centimeters per minute) to about 5.2 sccm, the second flow rate may range from about 0.4 sccm to about 0.6 sccm, the third flow rate may range from about 0.45 sccm to about 1.3 sccm, the pressure may range from about 100 mTorr (millitorr) to about 3 Torr, and the temperature of the substrate may range from about 25 degrees C. to about 45 degrees C.

Furthermore, as described above, the method may comprise disposing a heating element in the vapor deposition system, wherein at least one of the monomer, the cross-linking monomer, or the initiator flow through, over, or by the heating element, and elevating the temperature of the heating element. For example, when the initiator flows through, over, or by the heating element, the initiator may dissociate into two or more free radicals. The initiator free radicals, the monomer, and the cross-linking monomer adsorb on the substrate where surface polymerization may take place.

The heating element may comprise a filament composed of a tungsten-containing material, a tantalum-containing material, a molybdenum-containing material, a rhenium-containing material, a rhodium-containing material, a platinum-containing material, or a nickel-containing material, or a combination thereof. For example, the temperature of the heating element may range from about 200 degrees C. to about 800 degrees C. Additionally, for example, the temperature of the heating element may range from about 245 degrees C. to about 355 degrees C.

Figure 3:
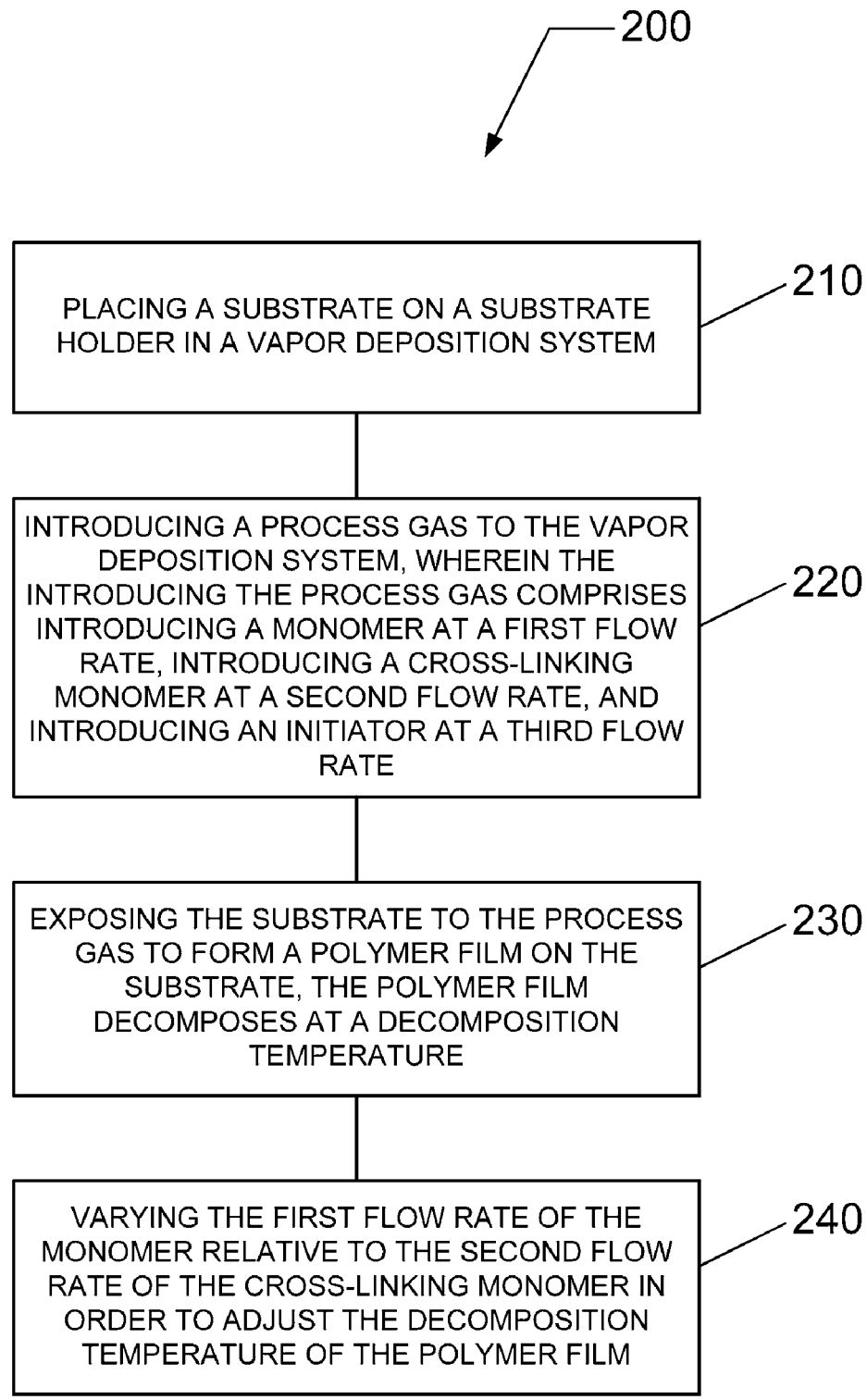
FIG. 3 is a flow chart of a method of depositing a sacrificial layer and/or capping layer on a substrate according to another embodiment.

Referring now to FIG. 3, a method of depositing a sacrificial layer and/or capping layer on a surface of a substrate is described according to another embodiment. For example, the sacrificial layer and/or capping layer may be utilized in connection with an air gap structure as depicted in FIGS. 1A through 1E. As shown in FIG. 3, the method comprises a flow chart 200 beginning in 210 with placing a substrate on a substrate holder in a vapor deposition system configured for an initiated CVD process. The substrate comprises a surface upon which the sacrificial layer and/or capping layer is deposited.

In 220, a process gas is introduced to the vapor deposition system, wherein the introducing the process gas comprises introducing a monomer at a first flow rate, introducing a cross-linking monomer (or cross-linker) at a second flow rate, and introducing an initiator at a third flow rate. The process gas may include additional monomers, additional cross-linking monomers, or additional initiators, or any combination of two or more thereof. Thereafter, in 230, the method comprises exposing the substrate to the process gas in order to form the sacrificial layer on the substrate, wherein the sacrificial layer thermally decomposes at a decomposition temperature.

In 240, the first flow rate of the monomer is varied relative to the second flow rate of the cross-linking monomer in order to adjust the decomposition temperature of the sacrificial layer. For example, by increasing the first flow rate relative to the second flow rate, the decomposition temperature may be decreased.

Following formation of the sacrificial layer, the sacrificial layer may be decomposed by elevating the temperature of the substrate at or above the decomposition temperature, and once decomposed the sacrificial layer may be removed from the substrate. Furthermore, for example, by increasing the first flow rate relative to the second flow rate, the percentage of removal of the polymer film may be increased.

Figure 4:
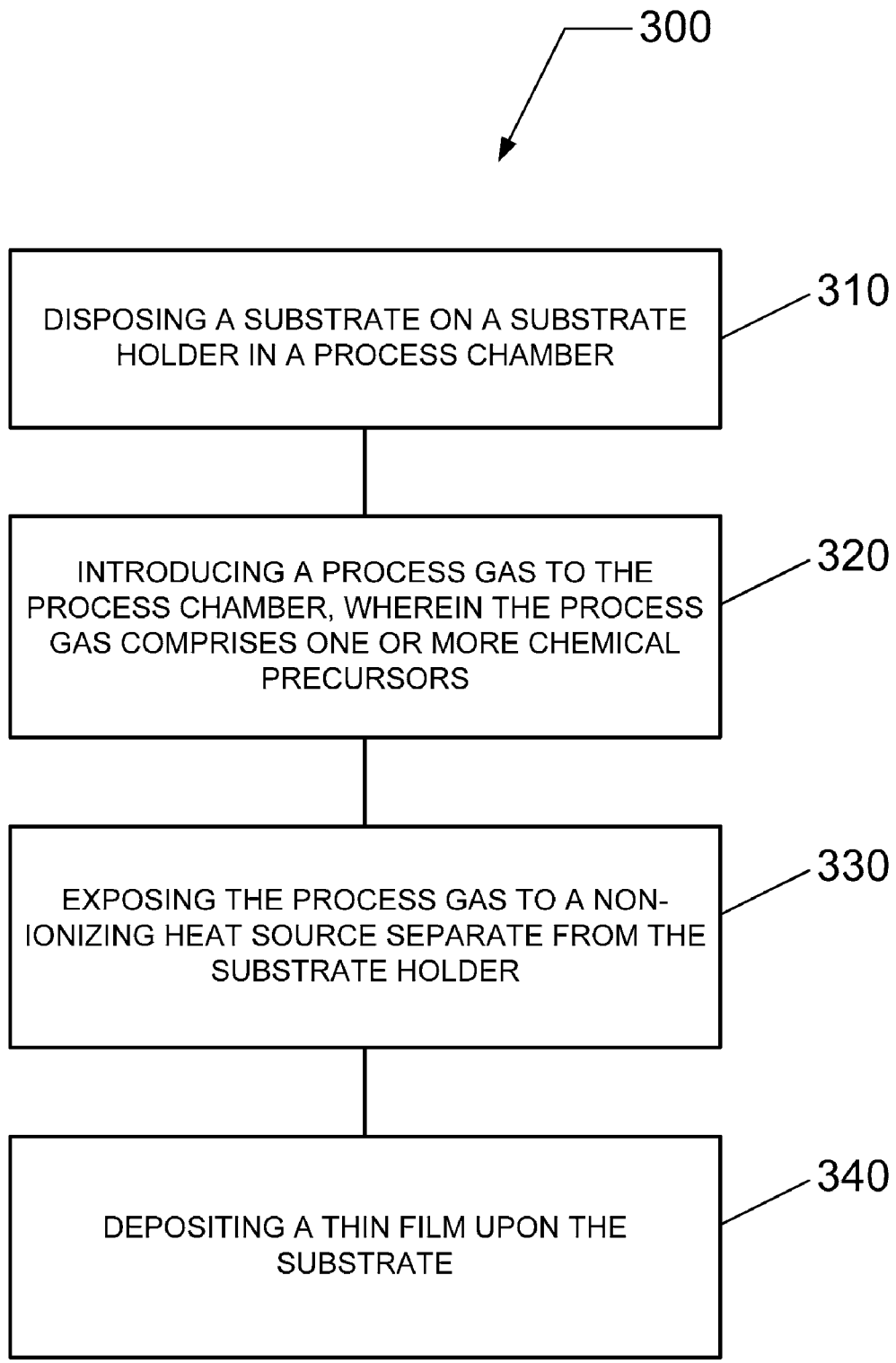
FIG. 4 is a flow chart of a method of depositing a sacrificial layer and/or capping layer on a substrate according to an embodiment.

Referring now to FIG. 4, a method of depositing a sacrificial layer and/or capping layer on a surface of a substrate is described according to another embodiment. For example, the sacrificial layer and/or capping layer may be utilized in connection with an air gap structure as depicted in FIGS. 1A through 1E. As shown in FIG. 4, the method comprises a flow chart 300 beginning in 310 with disposing a substrate on a substrate holder in a process chamber configured for a filament-assisted CVD (FACVD) process. The substrate comprises a surface upon which the sacrificial layer and/or capping layer, e.g., Si-containing material, or organic material, or graded organosilicon-containing material, is deposited. The silicon-containing material may include a silicon-containing dielectric material, such as a porous or non-porous low dielectric constant (low-k) dielectric material and/or an ultra-low-k dielectric material. For example, the silicon-containing material may include a SiCOH-containing material. The organic material may include a decomposable organic material.

In 320, a process gas is introduced to the chemical vapor deposition system, wherein the process gas comprises a silicon (Si)-containing chemical precursor for depositing a Si-containing material, or an organic chemical precursor for depositing an organic material, or both a Si-containing chemical precursor and an organic chemical precursor for depositing a graded organosilicon-containing material. The Si-containing chemical precursor may include one or more compounds suitable for depositing the Si-containing material on the substrate. The organic chemical precursor may include one or more compounds suitable for depositing the organic material on the substrate.

The Si-containing chemical precursor may include a compound possessing a Si-containing structure-forming molecule having a pore-generating molecular side group (e.g., attached porogen) weakly bonded to the Si-containing structure-forming molecule. Alternatively, the Si-containing chemical precursor may include a first compound possessing a Si-containing structure-forming molecule and a second compound possessing a pore-generating molecule (e.g., unattached porogen), wherein there is no bond between the pore-generating molecule and the Si-containing structure forming molecule. In either embodiment, bonded or un-bonded, the pore-generating molecule may comprise an organic material.

The following are non-limiting examples of Si-containing chemical precursors suitable for use with a distinct porogen according to the present invention. In the chemical formulas which follow and in all chemical formulas throughout this document, the term "independently" should be understood to denote that the subject R group is not only independently selected relative to other R groups bearing different superscripts, but is also independently selected relative to any additional species of the same R group. For example, in the formula $R^1{}_n(OR^2)_{4-n}Si$, when n is 2 or 3, the two or three $R^1$ groups need not be identical to each other or to $R^2$.

$R^1{}_n(OR^2)_{4-n}Si$ where $R^1$ can be independently H, $C_1$ to $C_4$, linear or branched, saturated, singly or multiply unsaturated, cyclic, partially or fully fluorinated; $R^2$ can be independently $C_1$ to $C_6$, linear or branched, saturated, singly or multiply unsaturated, cyclic, aromatic, partially or fully fluorinated; and n is 1 to 3.

EXAMPLE diethoxymethylsilane, dimethyldimethoxysilane $R^1{}_n(OR^2)_{3-n}Si$—O—$SiR^3{}_m(OR^4)_{3-m}$ where $R^1$ and $R^3$ can be independently H, $C_1$ to $C_4$, linear or branched, saturated, singly or multiply unsaturated, cyclic, partially or fully fluorinated; $R^2$ and $R^4$ can be independently $C_1$ to $C_6$, linear or branched, saturated, singly or multiply unsaturated, cyclic, aromatic, partially or fully fluorinated; n is 1 to 3; and m is 1 to 3.

EXAMPLE 1,3-dimethyl-1,3-diethoxydisiloxane $R^1{}_n(OR^2)_{3-n}Si$—$SiR^3{}_m(OR^4)_{3-m}$ where $R^1$ and $R^3$ can be independently H, $C_1$ to $C_4$, linear or branched, saturated, singly or multiply unsaturated, cyclic, partially or fully fluorinated, $R^2$ and $R^4$ can be independently $C_1$ to $C_6$, linear or branched, saturated, singly or multiply unsaturated, cyclic, aromatic, partially or fully fluorinated; n is 1 to 3; and m is 1 to 3.

EXAMPLE 1,2-dimethyl-1,1,2,2-tetraethoxydisilane $R^1{}_n(O(O)CR^2)_{4-n}Si$ where $R^1$ can be independently H, $C_1$ to $C_4$, linear or branched, saturated, singly or multiply unsaturated, cyclic, partially or fully fluorinated; $R^2$ can be independently H, $C_1$ to $C_6$, linear or branched, saturated, singly or multiply unsaturated, cyclic, aromatic, partially or fully fluorinated; and n is 1 to 3.

EXAMPLE dimethyldiacetoxysilane $R^1{}_n(O(O)CR^2)_{3-n}Si$—O—$SiR^3{}_m(O(O)CR^4)_{3-m}$ where $R^1$ and $R^3$ can be independently H, $C_1$ to $C_4$, linear or branched, saturated, singly or multiply unsaturated, cyclic, partially or fully fluorinated; $R^2$ and $R^4$ can be independently H, $C_1$ to $C_6$, linear or branched, saturated, singly or multiply unsaturated, cyclic, aromatic, partially or fully fluorinated; n is 1 to 3; and m is 1 to 3.

EXAMPLE 1,3-dimethyl-1,3-diacetoxydisiloxane $R^1{}_n(O(O)CR^2)_{3-n}Si$—$SiR^3{}_m(O(O)CR^4)_{3-m}$ where $R^1$ and $R^3$ can be independently H, $C_1$ to $C_4$, linear or branched, saturated, singly or multiply unsaturated, cyclic, partially or fully fluorinated; $R^2$ and $R^4$ can be independently H, $C_1$ to $C_6$, linear or branched, saturated, singly or multiply unsaturated, cyclic, aromatic, partially or fully fluorinated; n is 1 to 3; and m is 1 to 3.

EXAMPLE 1,2-dimethyl-1,1,2,2-tetraacetoxydisilane $R^1{}_n(O(O)CR^2)_{3-n}Si$—O—$SiR^3{}_m(OR^4)_{3-m}$ where $R^1$ and $R^3$ can be independently H, $C_1$ to $C_4$, linear or branched, saturated, singly or multiply unsaturated, cyclic, partially or fully fluorinated; $R^2$ can be independently H, $C_1$ to $C_6$, linear or branched, saturated, singly or multiply unsaturated, cyclic, aromatic, partially or fully fluorinated; $R^4$ can be independently $C_1$ to $C_6$, linear or branched, saturated, singly or multiply unsaturated, cyclic, aromatic, partially or fully fluorinated; n is 1 to 3; and m is 1 to 3.

EXAMPLE 1,3-dimethyl-1-acetoxy-3-ethoxydisiloxane $R^1{}_n(O(O)CR^2)_{3-n}Si-SiR^3{}_m(OR^4)_{3-m}$ where $R^1$ and $R^3$ can be independently H, $C_1$ to $C_4$, linear or branched, saturated, singly or multiply unsaturated, cyclic, partially or fully fluorinated; $R^2$ can be independently H, $C_1$ to $C_6$, linear or branched, saturated, singly or multiply unsaturated, cyclic, aromatic, partially or fully fluorinated; $R^4$ can be independently $C_1$ to $C_6$, linear or branched, saturated, singly or multiply unsaturated, cyclic, aromatic, partially or fully fluorinated; n is 1 to 3; and m is 1 to 3.

EXAMPLE 1,2-dimethyl-1-acetoxy-2-ethoxydisilane $R^1{}_n(OR^2)_p(O(O)CR^4)_{4-(n+p)}Si$ where $R^1$ can be independently H, $C_1$ to $C_4$, linear or branched, saturated, singly or multiply unsaturated, cyclic, partially or fully fluorinated; $R^2$ can be independently $C_1$ to $C_6$, linear or branched, saturated, singly or multiply unsaturated, cyclic, aromatic, partially or fully fluorinated; $R^4$ can be independently H, $C_1$ to $C_6$, linear or branched, saturated, singly or multiply unsaturated, cyclic, aromatic, partially or fully fluorinated; n is 1 to 3; and p is 1 to 3.

EXAMPLE methylacetoxy-t-butoxysilane $R^1{}_n(OR^2)_p(O(O)CR^4)_{3-n-p}Si-O-SiR^3{}_m(O(O)CR^5)_q(OR^6)_{3-m-q}$ where $R^1$ and $R^3$ can be independently H, $C_1$ to $C_4$, linear or branched, saturated, singly or multiply unsaturated, cyclic, partially or fully fluorinated; $R^2$ and $R^6$ can be independently $C_1$ to $C_6$, linear or branched, saturated, singly or multiply unsaturated, cyclic, aromatic, partially or fully fluorinated; $R^4$ and $R^5$ can be independently H, $C_1$ to $C_6$, linear or branched, saturated, singly or multiply unsaturated, cyclic, aromatic, partially or fully fluorinated; n is 1 to 3; m is 1 to 3; p is 1 to 3; and q is 1 to 3.

EXAMPLE 1,3-dimethyl-1,3-diacetoxy-1,3-diethoxydisiloxane $R^1{}_n(OR^2)_p(O(O)CR^4)_{3-n-p}Si-SiR^3{}_m(O(O)CR^5)_q(OR^6)_{3-m-q}$ where $R^1$ and $R^3$ can be independently H, $C_1$ to $C_4$, linear or branched, saturated, singly or multiply unsaturated, cyclic, partially or fully fluorinated; $R^2$, $R^6$ can be independently $C_1$ to $C_6$, linear or branched, saturated, singly or multiply unsaturated, cyclic, aromatic, partially or fully fluorinated; $R^4$, $R^5$ can be independently H, $C_1$ to $C_6$, linear or branched, saturated, singly or multiply unsaturated, cyclic, aromatic, partially or fully fluorinated; n is 1 to 3; m is 1 to 3; p is 1 to 3; and q is 1 to 3.

EXAMPLE 1,2-dimethyl-1,2-diacetoxy-1,2-diethoxydisilane cyclic siloxanes of the formula $(OSiR^1R^2)_x$, where $R^1$ and $R^2$ can be independently H, $C_1$ to $C_4$, linear or branched, saturated, singly or multiply unsaturated, cyclic, partially or fully fluorinated; and x may be any integer from 2 to 8.

EXAMPLES 1,3,5,7-tetramethylcyclotetrasiloxane, octamethylcyclotetrasiloxane

Provisos to all above precursor groups: 1) a porogen is added to the reaction mixture, and 2) a curing (e.g., anneal) step is used to remove substantially all of the included porogen from the deposited material to produce a dielectric constant k <2.6.

The above precursors may be mixed with porogen or have attached porogens, and may be mixed with other molecules of these classes and/or with molecules of the same classes except where n and/or m are from 0 to 3.

EXAMPLES

TEOS, triethoxysilane, di-tertiarybutoxysilane, silane, disilane, di-tertiarybutoxydiacetoxysilane, etc.

The following are additional formulas representing certain Si-containing chemical precursors suitable for use with a distinct porogen according to the present invention:

(a) the formula $R^1{}_n(OR^2)_p(O(O)CR^3)_{4-(n+p)}Si$ where $R^1$ is independently H or $C_1$ to $C_4$ linear or branched, saturated, singly or multiply unsaturated, cyclic, partially or fully fluorinated hydrocarbon; $R^2$ is independently $C_1$ to $C_6$ linear or branched, saturated, singly or multiply unsaturated, cyclic, aromatic, partially or fully fluorinated hydrocarbon; $R^3$ is independently H, $C_1$ to $C_6$ linear or branched, saturated, singly or multiply unsaturated, cyclic, aromatic, partially or fully fluorinated hydrocarbon; n is 1 to 3; and p is 0 to 3;

(b) the formula $R^1{}_n(OR^2)_p(O(O)CR^4)_{3-n-p}Si-O-SiR^3{}_m(O(O)CR^5)_q(OR^6)_{3-m-q}$ where $R^1$ and $R^3$ are independently H or $C_1$ to $C_4$ linear or branched, saturated, singly or multiply unsaturated, cyclic, partially or fully fluorinated hydrocarbon; $R^2$ and $R^6$ are independently $C_1$ to $C_6$ linear or branched, saturated, singly or multiply unsaturated, cyclic, aromatic, partially or fully fluorinated hydrocarbon; $R^4$ and $R^5$ are independently H, $C_1$ to $C_6$ linear or branched, saturated, singly or multiply unsaturated, cyclic, aromatic, partially or fully fluorinated hydrocarbon; n is 0 to 3; m is 0 to 3; q is 0 to 3; and p is 0 to 3; provided that n+m≧1, n+p≦3 and m+q≦3;

(c) the formula $R^1{}_n(OR^2)_p(O(O)CR^4)_{3-n-p}Si-SiR^3{}_m(O(O)CR^5)_q(OR^6)_{3-m-q}$ where $R^1$ and $R^3$ are independently H or $C_1$ to $C_4$ linear or branched, saturated, singly or multiply unsaturated, cyclic, partially or fully fluorinated hydrocarbon; $R^2$ and $R^6$ are independently $C_1$ to $C_6$ linear or branched, saturated, singly or multiply unsaturated, cyclic, aromatic, partially or fully fluorinated hydrocarbon; $R^4$ and $R^5$ are independently H, $C_1$ to $C_6$ linear or branched, saturated, singly or multiply unsaturated, cyclic, aromatic, partially or fully fluorinated hydrocarbon; n is 0 to 3; m is 0 to 3; q is 0 to 3; and p is 0 to 3; provided that n+m≧1, n+p≦3 and m+q≦3;

(d) the formula $R^1{}_n(OR^2)_p(O(O)CR^4)_{3-n-p}Si-R^7-SiR^3{}_m(O(O)CR^5)_q(OR^6)_{3-m-q}$ where $R^1$ and $R^3$ are independently H or $C_1$ to $C_4$ linear or branched, saturated, singly or multiply unsaturated, cyclic, partially or fully fluorinated hydrocarbon; $R^2$, $R^6$ and $R^7$ are independently $C_1$ to $C_6$ linear or branched, saturated, singly or multiply unsaturated, cyclic, aromatic, partially or fully fluorinated hydrocarbon; $R^4$ and $R^5$ are independently H, $C_1$ to $C_6$ linear or branched, saturated, singly or multiply unsaturated, cyclic, aromatic, partially or fully fluorinated hydrocarbon; n is 0 to 3; m is 0 to 3; q is 0 to 3; and p is 0 to 3; provided that n+m≧1, n+p≦3, and m+q≦3;

(e) the formula $(R^1{}_n(OR^2)_p(O(O)CR^3)_{4-(n+p)}Si)_tCH_{4-t}$ where $R^1$ is independently H or $C_1$ to $C_4$ linear or branched, saturated, singly or multiply unsaturated, cyclic, partially or fully fluorinated hydrocarbon; $R^2$ is independently $C_1$ to $C_6$ linear or branched, saturated, singly or multiply unsaturated, cyclic, aromatic, partially or fully fluorinated hydrocarbon; $R^3$ is independently H, $C_1$ to $C_6$ linear or branched, saturated, singly or multiply unsaturated, cyclic, aromatic, partially or fully fluorinated hydrocarbon; n is 1 to 3; p is 0 to 3; and t is 2 to 4; provided that n+p≦4;

(f) the formula $(R^1{}_n(OR^2)_p(O(O)CR^3)_{4-(n+p)}Si)_tNH_{3-t}$ where $R^1$ is independently H or $C_1$ to $C_4$ linear or branched, saturated, singly or multiply unsaturated, cyclic, partially or fully fluorinated hydrocarbon; $R^2$ is independently $C_1$ to $C_6$ linear or branched, saturated, singly or multiply unsaturated, cyclic, aromatic, partially or fully fluorinated hydrocarbon; $R^3$ is independently H, $C_1$ to $C_6$ linear or branched, saturated, singly or multiply unsaturated, cyclic, aromatic, partially or fully fluorinated hydrocarbon; n is 1 to 3; p is 0 to 3; and t is 1 to 3; provided that n+p≦4;

(g) cyclic siloxanes of the formula $(OSiR^1R^2)_x$, where $R^1$ and $R^2$ are independently H, $C_1$ to $C_4$, linear or branched, saturated, singly or multiply unsaturated, cyclic, partially or fully fluorinated, and x may be any integer from 2 to 8;

(h) cyclic silazanes of the formula $(NR^1SiR^1R^2)_x$, where $R^1$ and $R^2$ are independently H, $C_1$ to $C_4$, linear or branched, saturated, singly or multiply unsaturated, cyclic, partially or fully fluorinated, and x may be any integer from 2 to 8; and (i) cyclic carbosilanes of the formula $[(CR^1R^2)(SiR^1R^2)]_x$, where $R^1$ and $R^2$ are independently H, $C_1$ to $C_4$, linear or branched, saturated, singly or multiply unsaturated, cyclic, partially or fully fluorinated, and x may be any integer from 2 to 8.

Although reference is made throughout the specification to siloxanes and disiloxanes as precursors and porogenated precursors, it should be understood that the invention is not limited thereto, and that other siloxanes, such as trisiloxanes and other linear siloxanes of even greater length, are also within the scope of the invention.

The above precursors may be mixed with other molecules of these same classes and/or with molecules of the same classes except where n and/or m are from 0 to 3.

The following are non-limiting examples of materials suitable for use as porogens when forming a Si-containing material or as an organic precursor when forming an organic material according to several embodiments:

1) Cyclic hydrocarbons of the general formula $C_nH_{2n}$, where n=4–14, where the number of carbons in the cyclic structure is between 4 and 10, and where there can be a plurality of simple or branched hydrocarbons substituted onto the cyclic structure.

Examples include: cyclohexane, trimethylcyclohexane, 1-methyl-4(1-methylethyl)cyclohexane, cyclooctane, methylcyclooctane, etc.

2) Linear or branched, saturated, singly or multiply unsaturated hydrocarbons of the general formula $C_nH_{(2n+2)-2y}$, where n=2-20, and where y=0-n.

Examples include: ethylene, propylene, acetylene, neohexane, etc.

3) Singly or multiply unsaturated cyclic hydrocarbons of the general formula $C_nH_{2n-2x}$ where x is the number of unsaturated sites in the molecule, n=4-14, where the number of carbons in the cyclic structure is between 4 and 10, and where there can be a plurality of simple or branched hydrocarbons substituted onto the cyclic structure. The unsaturation can be located inside endocyclic or on one of the hydrocarbon substituents to the cyclic structure.

Examples include cyclohexene, vinylcyclohexane, dimethylcyclohexene, t-butylcyclohexene, alpha-terpinene, pinene, 1,5-dimethyl-1,5-cyclooctadiene, vinyl-cyclohexene, etc.

4) Bicyclic hydrocarbons of the general formula $C_nH_{2n-2}$, where n=4-14, where the number of carbons in the bicyclic structure is between 4 and 12, and where there can be a plurality of simple or branched hydrocarbons substituted onto the cyclic structure.

Examples include, norbornane, spiro-nonane, decahydronaphthalene, etc.

5) Multiply unsaturated bicyclic hydrocarbons of the general formula $C_nH_{2n-(2+2x)}$ where x is the number of unsaturated sites in the molecule, n=4-14, where the number of carbons in the bicyclic structure is between 4 and 12, and where there can be a plurality of simple or branched hydrocarbons substituted onto the cyclic structure. The unsaturation can be located inside endocyclic or on one of the hydrocarbon substituents to the cyclic structure.

Examples include camphene, norbornene, norbornadiene, etc.

6) Tricyclic hydrocarbons of the general formula $C_nH_{2n-4}$, where n=4-14, where the number of carbons in the tricyclic structure is between 4 and 12, and where there can be a plurality of simple or branched hydrocarbons substituted onto the cyclic structure.

Examples include adamantane.

The process gas may further include an inert gas, such as a noble gas. The process gas may exclude an oxidizing agent. Alternatively, the process gas may include an oxidizing agent. Furthermore, the process gas may exclude an initiator. Alternatively, the process gas may include an initiator. Further yet, the process gas may include both an oxidizing agent and an initiator.

Figure 5:
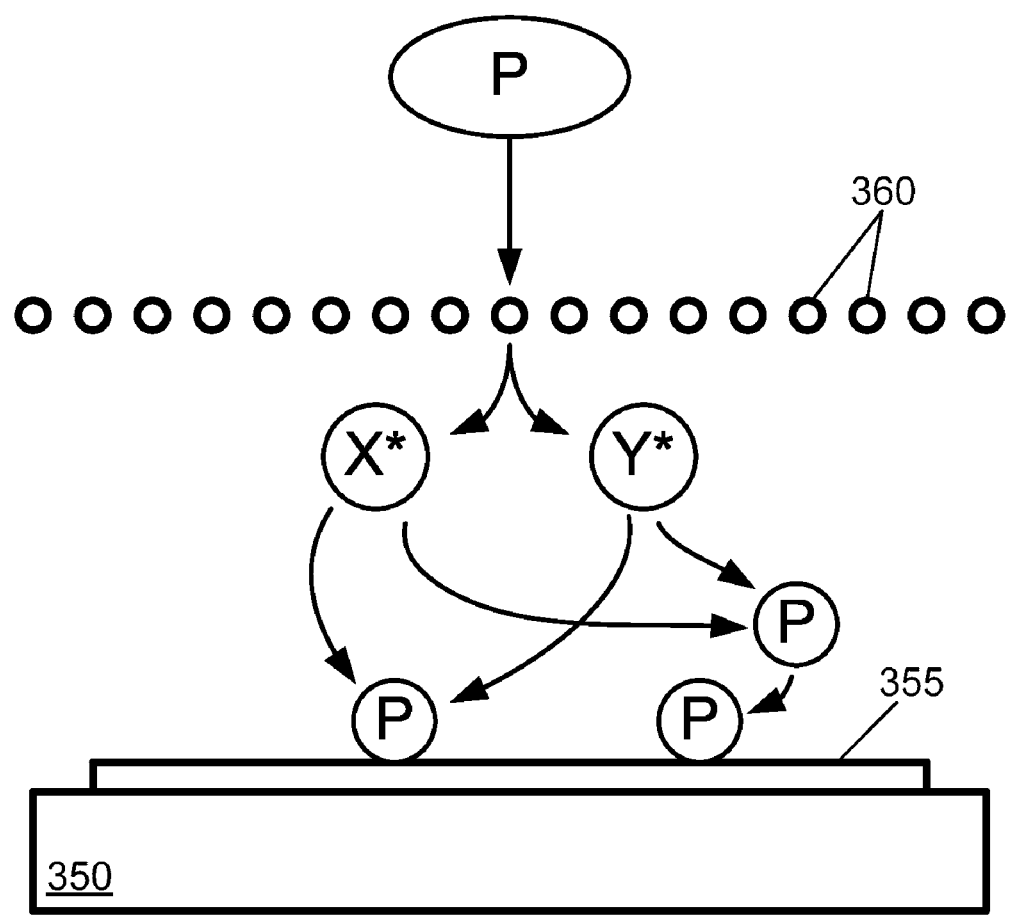
FIG. 5 illustrates a method of depositing a sacrificial layer and/or capping layer on a substrate according to an embodiment.

In 330, the method comprises exposing the process gas to a non-ionizing heat source separate from the substrate holder. The non-ionizing heat source may be configured to pyrolize (i.e., produce gaseous phase molecular fragments) one or more species in the chemical precursor. For example, the non-ionizing heat source may be elevated to a heat source temperature sufficient to pyrolize one or more species in the chemical precursor. For example, as illustrated in FIG. 5, a chemical precursor (P) flows through, over, or near a heating element 360, such as a resistively-heated conducting filament suspended near or above a surface of a substrate 355 resting on a substrate holder 350. The heating element 360 is elevated to a heat source temperature where the chemical precursor (P) decomposes into molecular fragments (X* and Y*). The molecular fragments can adsorb on the substrate where surface reaction may take place. For example, the heating element 360 may be elevated to a heat source temperature ranging from about 500 degrees C. to about 1500 degree C. Additionally, for example, the heating element 360 may be elevated to a heat source temperature ranging from about 500 degrees C. to about 1300 degree C.

Thereafter, the method may comprise maintaining the substrate 355 at a substrate temperature sufficiently high to induce deposition and film formation of the gaseous phase molecular fragments on the substrate 355. The substrate holder 350 may be configured to maintain the substrate 355 at a substrate temperature of about 20 degrees C. or greater. Depent upon the application, the substrate temperature may have an upper limit. For example, the upper limit for the substrate temperature may be selected to be less than the thermal decomposition temperature of another layer that pre-exists on the substrate 355.

When depositing a Si-containing material, for example, the substrate holder 350 may be configured to maintain the substrate at a substrate temperature of about 20 degrees C. to about 350 degrees C. Furthermore, the substrate holder 350 may be configured to maintain the substrate at a substrate temperature of about 80 degrees C. to about 350 degrees C. Further yet, the substrate holder 350 may be configured to maintain the substrate at a substrate temperature of about 150 degrees C. to about 230 degrees C.

When depositing an organic material, for example, the substrate holder 350 may be configured to maintain the substrate at a substrate temperature of about 20 degrees C. to about 300 degrees C. Additionally, the substrate holder 350 may be configured to maintain the substrate at a substrate temperature of about 60 degrees C. to about 270 degrees C. Further yet, the substrate holder 350 may be configured to maintain the substrate at a substrate temperature of about 80 degrees C. to about 200 degrees C. Furthermore, the substrate holder 350 may be configured to maintain the substrate at a substrate temperature of about 110 degrees C. to about 180 degrees C.

In 340, a sacrificial layer and/or capping layer, such as a Si-containing material, or an organic material, or a graded organosilicon-containing material is deposited upon the substrate 355. The Si-containing material may have a dielectric constant of less than about 3 as-deposited.

When preparing a graded organosilicon-containing material, the process gas includes a Si-containing chemical precursor and an organic chemical precursor. During the depositing of the graded organosilicon-containing material, an amount of the Si-containing chemical precursor relative to an amount of the organic chemical precursor is adjusted to spatially vary relative concentrations of Si-containing material and organic material through a thickness of the graded organosilicon-containing material. The adjustment may take place in a step-wise manner, and/or it may take place gradually (e.g., ramp a relative amount up or down).

As described above, the method may comprise disposing a heating element in the chemical vapor deposition system, wherein the process gas, including the chemical precursor, flows through, over, or by the heating element 360. For example, the temperature of the heating element 360 is elevated such that when the chemical precursor flows through, over, or by the heating element 360, the chemical precursor may decompose into two or more molecular fragments. The fragments of the chemical precursor can adsorb on the substrate 355 where surface reaction may take place.

The heating element may comprise a filament composed of a tungsten-containing material, a tantalum-containing material, a molybdenum-containing material, a rhenium-containing material, a rhodium-containing material, a platinum-containing material, or a nickel-containing material, or a combination thereof. The temperature range for the heating element depends on the material properties of the heating element. For example, the temperature of the heating element may range from about 500 degrees C. to about 1500 degrees C. Additionally, for example, the temperature of the heating element may range from about 500 degrees C. to about 1300 degrees C.

Figure 6:
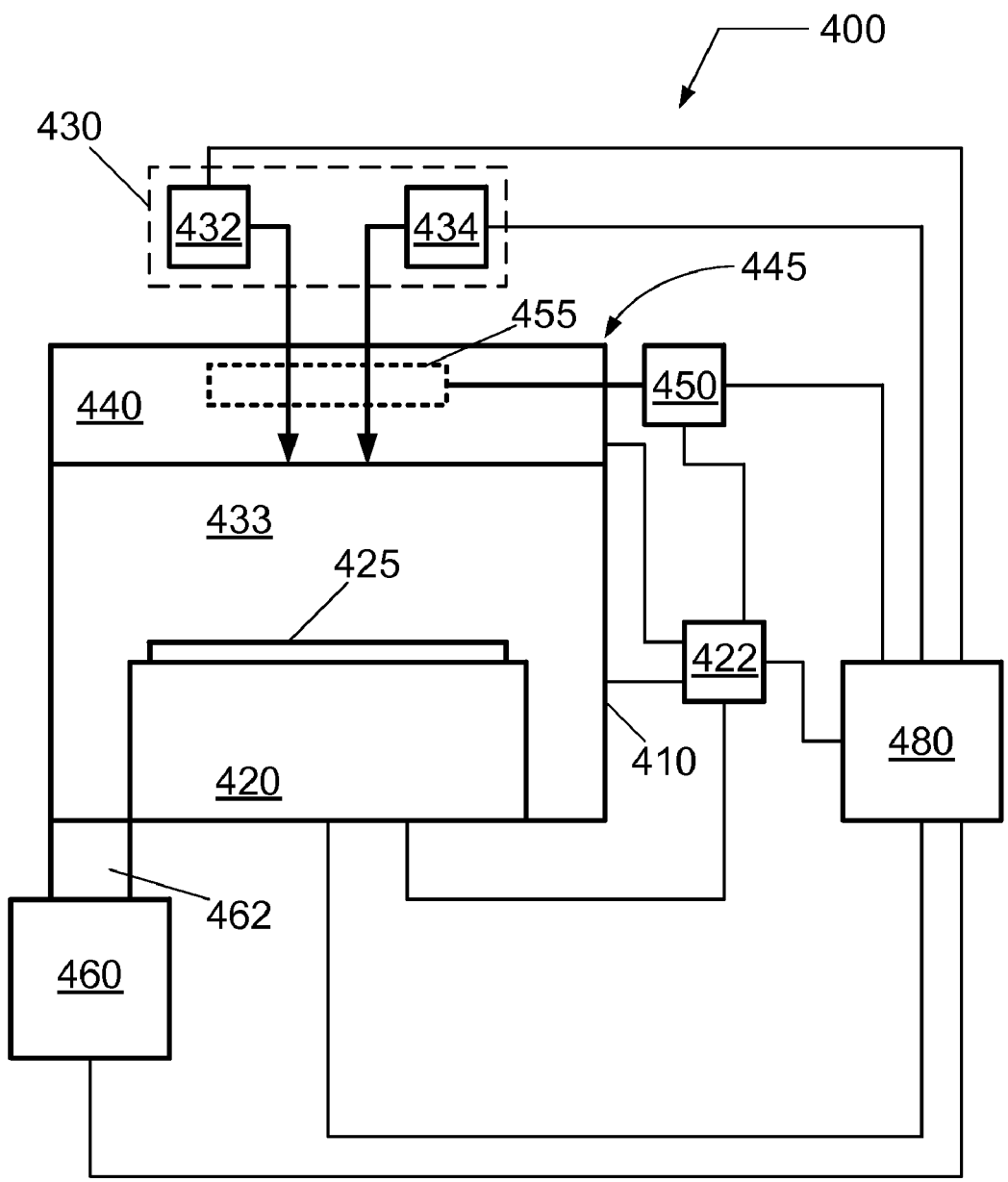
FIG. 6 is a schematic cross-sectional view of a vapor deposition system according to an embodiment.

According to an embodiment, FIG. 6 schematically illustrates a vapor deposition system 400 for depositing a thin film, such as a sacrificial layer and/or capping layer. Vapor deposition system 400 can include a chemical vapor deposition (CVD) system, whereby a film forming composition is thermally activated or decomposed in order to form a film on a substrate. For example, the vapor deposition system 400 may comprise an initiated CVD (iCVD) system or a filament-assisted CVD (FACVD) system.

The vapor deposition system 400 comprises a process chamber 410 having a substrate holder 420 configured to support a substrate 425, upon which the thin film is formed. Furthermore, the substrate holder 420 is configured to control the temperature of the substrate 425 at a temperature suitable for the film forming reactions.

The process chamber 410 is coupled to a film forming composition delivery system 430 configured to introduce a process gas to the process chamber 410 through a gas distribution system 440. Furthermore, a gas heating device 445 is coupled to the gas distribution system 440 and configured to chemically modify the film forming composition. The gas heating device 445 comprises one or more heating elements 455 configured to interact with one or more constituents in the process gas, and a power source 450 that is coupled to the one or more heating elements 455 and is configured to deliver power to the one or more heating elements 455. For example, the one or more heating elements 455 can comprise one or more resistive heating elements. When electrical current flows through and affects heating of the one or more resistive heating elements, the interaction of these heated elements with one or more constituents in the process gas causes pyrolysis of one or more constituents of the process gas.

The process chamber 410 is further coupled to a vacuum pumping system 460 through a duct 462, wherein the vacuum pumping system 460 is configured to evacuate the process chamber 410 and the gas distribution system 440 to a pressure suitable for forming the thin film on the substrate 425 and suitable for pyrolysis of the process gas.

The film forming composition delivery system 430 can include one or more material sources configured to introduce the process gas to the gas distribution system 440. For example, the process gas may include one or more gases, or one or more vapors formed in one or more gases, or a mixture of two or more thereof. The film forming composition delivery system 430 can include one or more gas sources, or one or more vaporization sources, or a combination thereof. Herein vaporization refers to the transformation of a material (normally stored in a state other than a gaseous state) from a non-gaseous state to a gaseous state. Therefore, the terms "vaporization," "sublimation" and "evaporation" are used interchangeably herein to refer to the general formation of a vapor (gas) from a solid or liquid precursor, regardless of whether the transformation is, for example, from solid to liquid to gas, solid to gas, or liquid to gas.

When the process gas is introduced to the gas distribution system 440, one or more constituents of the process gas are subjected to pyrolysis by the gas heating device 445 described above. The process gas can include film precursors that may or may not be fragmented by pyrolysis in the gas distribution system 440. The film precursor or precursors may include the principal atomic or molecular species of the film desired to be produced on the substrate. For example, the film precursor or precursors may include a monomer for the polymer film to be deposited. Additionally, the film forming composition can include a polymerizing agent (or cross-linker) that may or may not be fragmented by pyrolysis in the gas distribution system 440. The polymerizing agent may assist with the polymerization of a film precursor or fragmented film precursor on substrate 425. For example, the polymerizing agent may include a cross-linking monomer for the polymer film to be deposited.

Additionally yet, the process can include a reducing agent that may or may not be fragmented by pyrolysis in the gas distribution system 440. The reducing agent or agents may assist with the reduction of a film precursor on substrate 425. For instance, the reducing agent or agents may react with a part of or all of the film precursor on substrate 425.

Further yet, the process gas can include an initiator that may or may not be fragmented by pyrolysis in the gas distribution system 440. An initiator or fragmented initiator may assist with the fragmentation of a film precursor, or the polymerization of a film precursor. The use of an initiator can permit higher deposition rates at lower heat source temperatures. For instance, the one or more heating elements can be used to fragment the initiator to produce radical species of the initiator (i.e., a fragmented initiator) that are reactive with one or more of the remaining constituents in the process gas. Furthermore, for instance, the fragmented initiator or initiator radicals can catalyze the formation of radicals of the process gas.

As an example, when forming a sacrificial layer, the process gas may comprise a monomer, a cross-linking monomer, and an initiator. The monomer, the cross-linking monomer, and the initiator may be selected from any one of the chemical species identified above. Additionally, as another example, when forming a sacrificial layer and/or capping layer, the process gas may comprise a silicon (Si)-containing chemical precursor for depositing a Si-containing material, or an organic chemical precursor for depositing an organic material, or both a Si-containing chemical precursor and an organic chemical precursor for depositing a graded organosilicon-containing material.

According to one embodiment, the film forming composition delivery system 430 can include a first material source 432 configured to introduce one or more film precursors, such as a Si-containing chemical precursor, an organic chemical precursor, or a monomer and a cross-linking monomer, to the gas distribution system 440, and a second material source 434 configured to introduce an optional (chemical) initiator to the gas distribution system 440. Furthermore, the film forming composition delivery system 430 can include additional gas sources configured to introduce an inert gas, a carrier gas or a dilution gas. For example, the inert gas, carrier gas or dilution gas can include a noble gas, i.e., He, Ne, Ar, Kr, Xe, or Rn.

The one or more heating elements 455 can comprise one or more resistive heating elements. Additionally, for example, the one or more heating elements 455 may include a metal-containing ribbon or filament. Furthermore, for example, the one or more heating elements 455 can be composed of a resistive metal, a resistive metal alloy, a resistive metal nitride, or a combination of two or more thereof. The one or more heating elements 455 may comprise a filament or ribbon composed of a tungsten-containing material, a tantalum-containing material, a molybdenum-containing material, a rhenium-containing material, a rhodium-containing material, a platinum-containing material, or a nickel-containing material, or a combination thereof.

When the power source 450 couples electrical power to the one or more heating elements 455, the one or more heating elements 455 may be elevated to a temperature sufficient to pyrolize one or more constituents of the film forming composition. Power source 450 may include a direct current (DC) power source, or it may include an alternating current (AC) power source. Power source 450 may be configured to couple electrical power to the one or more heating elements 455 through a direct electrical connection to the one or more heating elements 455. Alternatively, power source 450 may be configured to couple electrical power to the one or more heating elements 455 through induction. Furthermore, for example, the power source 50 can be configured to modulate the amplitude of the power, or pulse the power. Furthermore, for example, the power source 50 can be configured to perform at least one of setting, monitoring, adjusting or controlling a power, a voltage, or a current.

Referring still to FIG. 6, a temperature control system 422 can be coupled to the gas distribution system 440, the gas heating device 445, the process chamber 410 and/or the substrate holder 420, and configured to control the temperature of one or more of these components. The temperature control system 422 can include a temperature measurement system configured to measure the temperature of the gas distribution system 440 at one or more locations, the temperature of the gas heating device 445 at one or more locations, the temperature of the process chamber 410 at one or more locations and/or the temperature of the substrate holder 420 at one or more locations. The measurements of temperature can be used to adjust or control the temperature at one or more locations in vapor deposition system 400.

The temperature measuring device, utilized by the temperature measurement system, can include an optical fiber thermometer, an optical pyrometer, a band-edge temperature measurement system as described in pending U.S. patent application Ser. No. 10/168,544, filed on Jul. 2, 2002, the contents of which are incorporated herein by reference in their entirety, or a thermocouple such as a K-type thermocouple. Examples of optical thermometers include: an optical fiber thermometer commercially available from Advanced Energies, Inc., Model No. OR2000F; an optical fiber thermometer commercially available from Luxtron Corporation, Model No. M600; or an optical fiber thermometer commercially available from Takaoka Electric Mfg., Model No. FT-1420.

Alternatively, when measuring the temperature of one or more resistive heating elements, the electrical characteristics of each resistive heating element can be measured. For example, two or more of the voltage, current or power coupled to the one or more resistive heating elements can be monitored in order to measure the resistance of each resistive heating element. The variations of the element resistance can arise due to variations in temperature of the element which affects the element resistivity.

According to program instructions from the temperature control system 422 or controller 480 or both, the power source 450 can be configured to operate the gas heating device 445, e.g., the one or more heating elements, at a temperature ranging from approximately 200 degrees C. to approximately 1500 degrees C. For example, in an iCVD process, the temperature can range from approximately 200 degrees C. to approximately 800 degrees C. Additionally, for example, in an iCVD process, the temperature can range from approximately 245 degrees C. to approximately 335 degrees C. Alternatively, for example, in an FACVD process, the temperature can range from approximately 500 degrees C. to approximately 1500 degrees C. Additionally, for example, in an FACVD process, the temperature can range from approximately 500 degrees C. to approximately 1300 degrees C. The temperature can be selected based upon the process gas and, more particularly, the temperature can be selected based upon a constituent of the process gas.

Additionally, according to program instructions from the temperature control system 422 or the controller 480 or both, the temperature of the gas distribution system 440 can be set to a value approximately equal to or less than the temperature of the gas heating device 445, i.e., the one or more heating elements. The temperature can be selected to be approximately equal to or less than the temperature of the one or more heating elements, and to be sufficiently high to prevent condensation which may or may not cause film formation on surfaces of the gas distribution system and reduce the accumulation of residue.

Additionally yet, according to program instructions from the temperature control system 422 or the controller 480 or both, the temperature of the process chamber 410 can be set to a value less than the temperature of the heat source 445, i.e., the one or more heating elements. The temperature can be selected to be less than the temperature of the one or more resistive film heating elements, and to be sufficiently high to prevent condensation which may or may not cause film formation on surfaces of the process chamber and reduce the accumulation of residue.

Once process gas enters the process space 433, constituents of the process gas adsorbs on the substrate surface, and film forming reactions proceed to produce a thin film on the substrate 425. According to program instructions from the temperature control system 422 or the controller 480 or both, the substrate holder 420 is configured to set the temperature of substrate 425 to a value less than the temperature of the gas heating device 445, the temperature of the gas distribution system 440, and the process chamber 410. For example, the substrate temperature can be approximately 20 degrees C. or greater. However, the temperature may be less than or greater than room temperature.

The substrate holder 420 comprises one or more temperature control elements coupled to the temperature control system 422. The temperature control system 422 can include a substrate heating system, or a substrate cooling system, or both. For example, substrate holder 420 can include a substrate heating element or substrate cooling element (not shown) beneath the surface of the substrate holder 420. For instance, the heating system or cooling system can include a re-circulating fluid flow that receives heat from substrate holder 420 and transfers heat to a heat exchanger system (not shown) when cooling, or transfers heat from the heat exchanger system to the substrate holder 420 when heating. The cooling system or heating system may include heating/cooling elements, such as resistive heating elements, or thermoelectric heaters/coolers located within substrate holder 420. Additionally, the heating elements or cooling elements or both can be arranged in more than one separately controlled temperature zone. The substrate holder 420 may have two thermal zones, including an inner zone and an outer zone. The temperatures of the zones may be controlled by heating or cooling the substrate holder thermal zones separately.

Additionally, the substrate holder 420 comprises a substrate clamping system (e.g., electrical or mechanical clamping system) to clamp the substrate 425 to the upper surface of substrate holder 420. For example, substrate holder 420 may include an electrostatic chuck (ESC).

Furthermore, the substrate holder 420 can facilitate the delivery of heat transfer gas to the back-side of substrate 425 via a backside gas supply system to improve the gas-gap thermal conductance between substrate 425 and substrate holder 420. Such a system can be utilized when temperature control of the substrate is required at elevated or reduced temperatures. For example, the backside gas system can comprise a two-zone gas distribution system, wherein the backside gas (e.g., helium) pressure can be independently varied between the center and the edge of substrate 425.

Vacuum pumping system 460 can include a turbo-molecular vacuum pump (TMP) capable of a pumping speed up to approximately 5000 liters per second (and greater) and a gate valve for throttling the chamber pressure. For example, a 1000 to 3000 liter per second TMP can be employed. TMPs can be used for low pressure processing, typically less than approximately 1 Torr. For high pressure processing (i.e., greater than approximately 1 Torr), a mechanical booster pump and dry roughing pump can be used. Furthermore, a device for monitoring chamber pressure (not shown) can be coupled to the process chamber 410. The pressure measuring device can be, for example, a capacitance manometer.

Referring still to FIG. 6, the vapor deposition system 400 can further comprise controller 480 that comprises a microprocessor, memory, and a digital I/O port capable of generating control voltages sufficient to communicate and activate inputs to vapor deposition system 400 as well as monitor outputs from vapor deposition system 400. Moreover, controller 480 can be coupled to and can exchange information with the process chamber 410, the substrate holder 420, the temperature control system 422, the film forming composition supply system 430, the gas distribution system 440, the gas heating device 445, and the vacuum pumping system 460, as well as the backside gas delivery system (not shown), and/or the electrostatic clamping system (not shown). A program stored in the memory can be utilized to activate the inputs to the aforementioned components of vapor deposition system 400 according to a process recipe in order to perform the method of depositing a thin film.

Controller 480 may be locally located relative to the vapor deposition system 400, or it may be remotely located relative to the vapor deposition system 400 via an internet or intranet. Thus, controller 480 can exchange data with the vapor deposition system 400 using at least one of a direct connection, an intranet, or the internet. Controller 480 may be coupled to an intranet at a customer site (i.e., a device maker, etc.), or coupled to an intranet at a vendor site (i.e., an equipment manufacturer). Furthermore, another computer (i.e., controller, server, etc.) can access controller 480 to exchange data via at least one of a direct connection, an intranet, or the internet.

The vapor deposition system 400 can be periodically cleaned using an in-situ cleaning system (not shown) coupled to, for example, the process chamber 410 or the gas distribution system 440. Per a frequency determined by the operator, the in-situ cleaning system can perform routine cleanings of the vapor deposition system 400 in order to remove accumulated residue on internal surfaces of vapor deposition system 400. The in-situ cleaning system can, for example, comprise a radical generator configured to introduce chemical radical capable of chemically reacting and removing such residue. Additionally, for example, the in-situ cleaning system can, for example, include an ozone generator configured to introduce a partial pressure of ozone. For instance, the radical generator can include an upstream plasma source configured to generate oxygen or fluorine radical from oxygen ($O_2$), nitrogen trifluoride ($NF_3$), $O_3$, $XeF_2$, $ClF_3$, or $C_3F_8$ (or, more generally, $C_xF_y$), respectively. The radical generator can include an ASTRON® reactive gas generator, commercially available from MKS Instruments, Inc., ASTeX® Products (90 Industrial Way, Wilmington, Mass. 01887).

Further details on an iCVD processing system or an FACVD processing system are described in pending U.S. patent application Ser. No. 11/693,067, entitled "Vapor Deposition System and Method of Operating", and pending U.S. patent application Ser. No. 11/044,574, entitled "Gas Heating Device for Vapor Deposition System"; the entire contents of which are herein incorporated by reference in their entirety.

According to an example, for the preparation of a sacrificial layer, copolymerization of selected monomers and cross-linking monomers was performed to measure, among other things, deposition rate, onset temperature of degradation ($T_d$) (or decomposition temperature), and film removal percentage. Table 1 presents the deposition rate (nm/min, nanometers per minute), the onset temperature of degradation ($T_d$) (degrees C.), and the removal percentage (%) after heating the deposited film at 400 degrees C. for an hour under a nitrogen atmosphere for the four copolymers derived from permutations of monomers (npMA and CPMA) and cross-linking monomers (EGDMA and EGDA).

TABLE 1

| | Copolymer | |
|---|---|---|
| | P(npMA-co-EGDMA) | P(CPMA-co-EGDMA) |
| Deposition Rate (nm/min) | 61.5 | 63 |
| $T_d$ (degrees C.) | 230-240 | 240 |
| Removal Percent (%) after 400 degrees C. for 1 hour | 99.58 +/- 0.01 | 99.57 +/- 0.26 |

| | Copolymer | |
|---|---|---|
| | P(npMA-co-EGDA) | P(CPMA-co-EGDA) |
| Deposition Rate (nm/min) | 88.7 | 51.4 |
| $T_d$ (degrees C.) | 330 | 280-290 |
| Removal Percent (%) after 400 degrees C. for 1 hour | 95.56 +/- 0.25 | 90.74 +/- 0.48 |

P(npMA-co-EGDMA) and P(CPMA-co-EGDMA) decomposed cleanly (greater than 99% removal percentage); however, the onset temperatures for degradation were low compared to P(npMA-co-EGDA) and P(CPMA-co-EGDA). Increasing the amount of EGDMA in P(npMA-co-EGDMA) and P(CPMA-co-EGDMA) may improve the thermal stability, but the inventors suspect that an upper limit may exist at about 300 degrees C. (which is approximately the onset temperature for degradation of P(EGDMA)). On the other hand, despite of the fact that the copolymers P(npMA-co-EGDA) and P(CPMA-co-EGDA) did not decompose as cleanly as when EGDMA was used as the cross-linking monomer, the amount of residue may reduce with increasing the amount of the monomer. As for the monomer, npMA, as compared to CPMA, demonstrated an increased deposition rate, improved thermal stability, and increased removal percentage when cross-linked with EGDA.

As monomers, npMA and CPMA have approximately the same molecular weight (npMA: 156.22Da, CPMA: 154.21 Da), dimension (npMA: 10.13 Å* 5.20 Å* 5.30 Å; CPMA: 9.43 Å* 5.93 Å* 4.88 Å, as simulated by Gaussian Software), and vapor pressure (npMA: 0.923 torr; CPMA: 0.387 torr, calculated at 25 degrees C.). The major differences lie in the structures of the side groups, namely, neopentyl and cyclopentyl moieties. During polymerization, the presence of cyclopentyl groups in closer proximity to the radical center constitutes higher steric hindrance compared to that of neopentyl groups, and results in lower polymerization as well as deposition rates of homopolymer and copolymer. Indeed, at identical conditions, a lower deposition rate of P(CPMA) was observed (20 nm/min) compared to that of P(npMA) (30 nm/min). The availability of beta-hydrogen on cyclopentyl groups is unlikely to contribute to the lower removal percentage of P(CPMA-co-EGDA) since the beta hydrogens on alicyclic structure are much farther away (~2.5 Å) from ester oxygen compared to linear aliphatic side groups (~2.0 Å), such as in poly(n-pentyl methacrylate); the decomposition of P(CPMA) was also complete under the same thermal annealing conditions for P(npMA) which confirms that beta-hydrogen abstraction was not a major issue.

P(npMA-co-EGDA) may be used as a sacrificial intermetal layer because the material comprises, among other things, suitable thermal stability, high deposition rate, and the potential of improving the removal percentage by increasing the methacrylate monomer content. Spectroscopic features, chemical/solvent resistance, thermal stability, degradation rates, and mechanical properties of the copolymer were investigated on copolymers having different compositions in order to understand the relation between the compositions and the properties and eventually optimize the performance.

Figure 7:
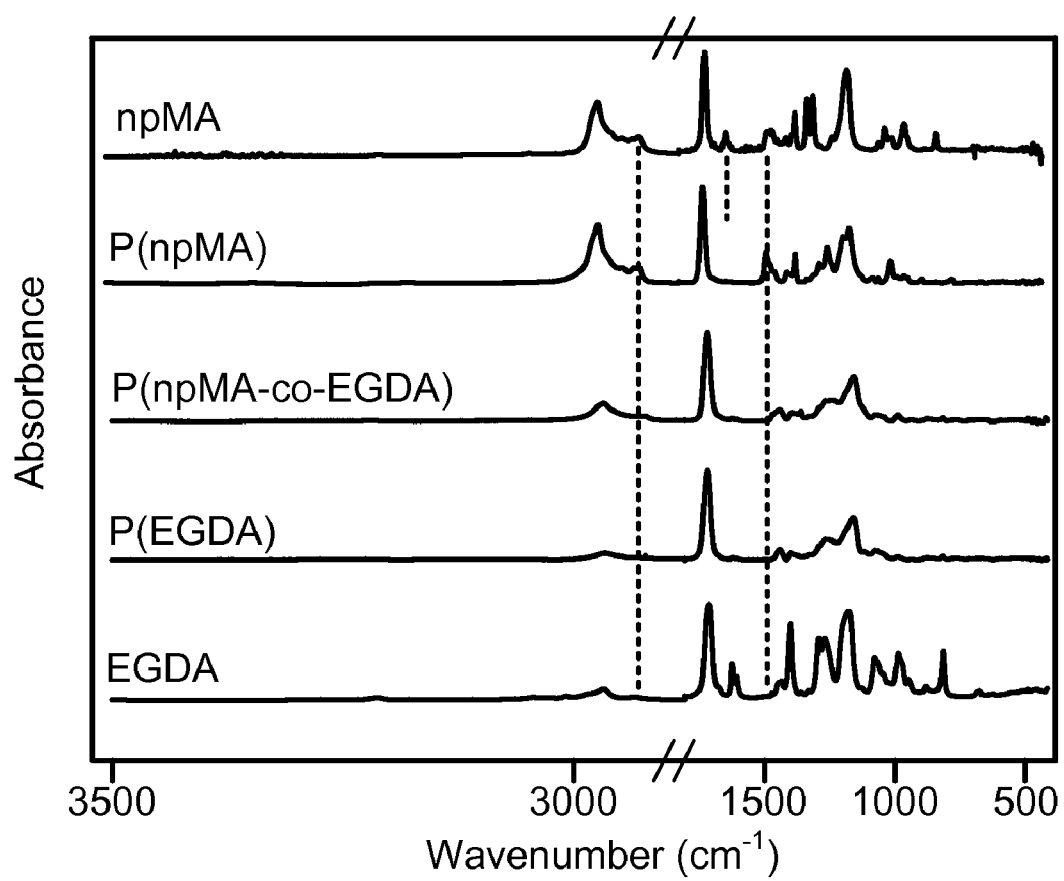
FIG. 7 provides Fourier transform infrared (FTIR) spectra for various material films.

Referring now to FIG. 7, Fourier transform infrared (FTIR) spectra of npMA and EGDA monomers, their respective homopolymers P(npMA) and P(EGDA), as well as one of the copolymers P(npMA-co-EGDA) (Flow rate of npMA: 1.0 sccm). The peak of medium intensity at 1640 $cm^{-1}$ is characteristic of carbon-carbon double bonds for methacrylate monomers. The doublet peaks at 1635 $cm^{-1}$ and 1620 $cm^{-1}$ are characteristic of acrylic monomers due to symmetric and asymmetric stretching of carbon-carbon double bonds. Upon polymerization, these peaks disappear, indicating the complete consumption of vinyl bonds and confirming the feasibility of iCVD methodology. The FTIR spectrum of P(EGDA) shows a peak having marginally low intensity at the wavenumber characteristic of carbon-carbon double bond stretching, suggesting the presence of a small percentage of polymerizable groups in the polymer, as well as the homopolymers of other cross-linking monomers (FTIR not shown). This is quite common in polymerization of multifunctional monomers. Polymerizable groups not consumed at the initial stage of polymerization tend to survive as the reaction proceeds due to decreasing mobility of the polymer matrix.

The peak around 1730 $cm^{-1}$ is the stretching of carbonyl group. The carbonyl stretching modes at 1721 $cm^{-1}$ for npMA, 1728 $cm^{-1}$ for P(npMA) and EGDA, and 1735 $cm^{-1}$ for P(EGDA). The peak at 2870 $cm^{-1}$ is indicative of the methyl groups on neopentyl moieties of npMA and P(npMA), but is not observed for EGDA and its homopolymer, which both lack methyl groups. The peaks at 1480 $cm^{-1}$ and 1450 $cm^{-1}$ are C—H bending modes for npMA and EGDA, respectively, and these peaks do not show appreciable shift in the respective polymers. Both 1480 $cm^{-1}$ and 1450 $cm^{-1}$ were observed in the FTIR spectrum of P(npMA-co-EGDA) copolymer with attenuated intensities.

Figure 8:
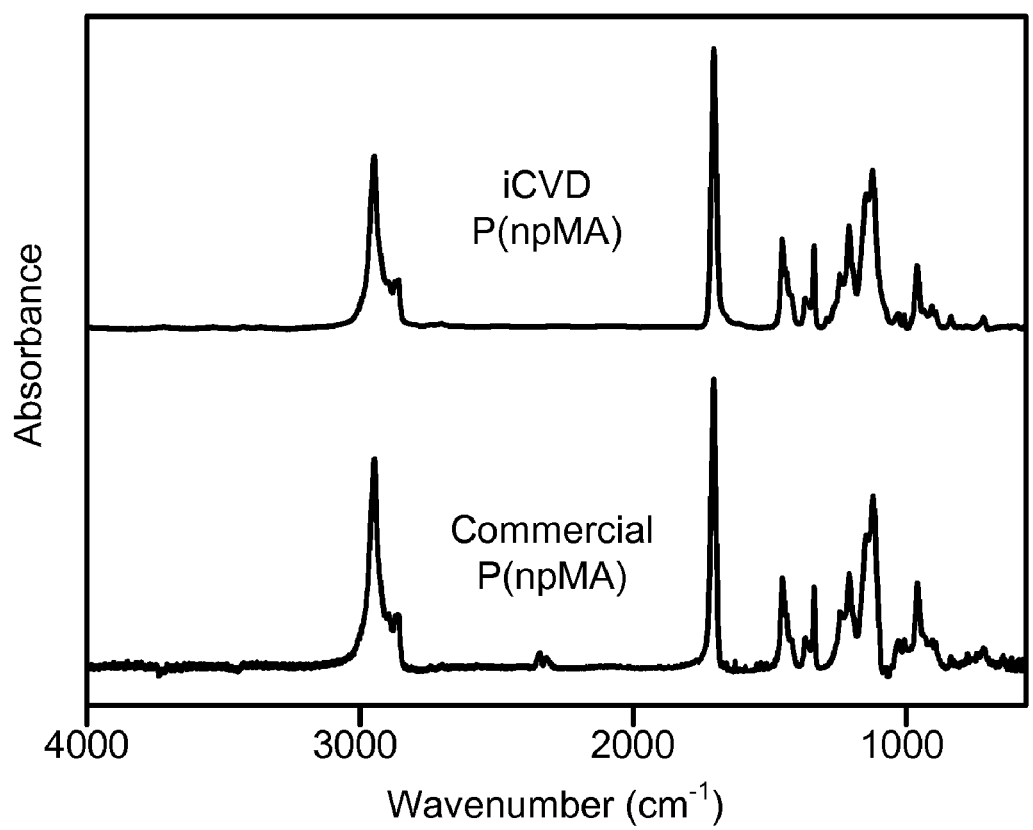
FIG. 8 provides FTIR spectra for various material films.
Figure 9:
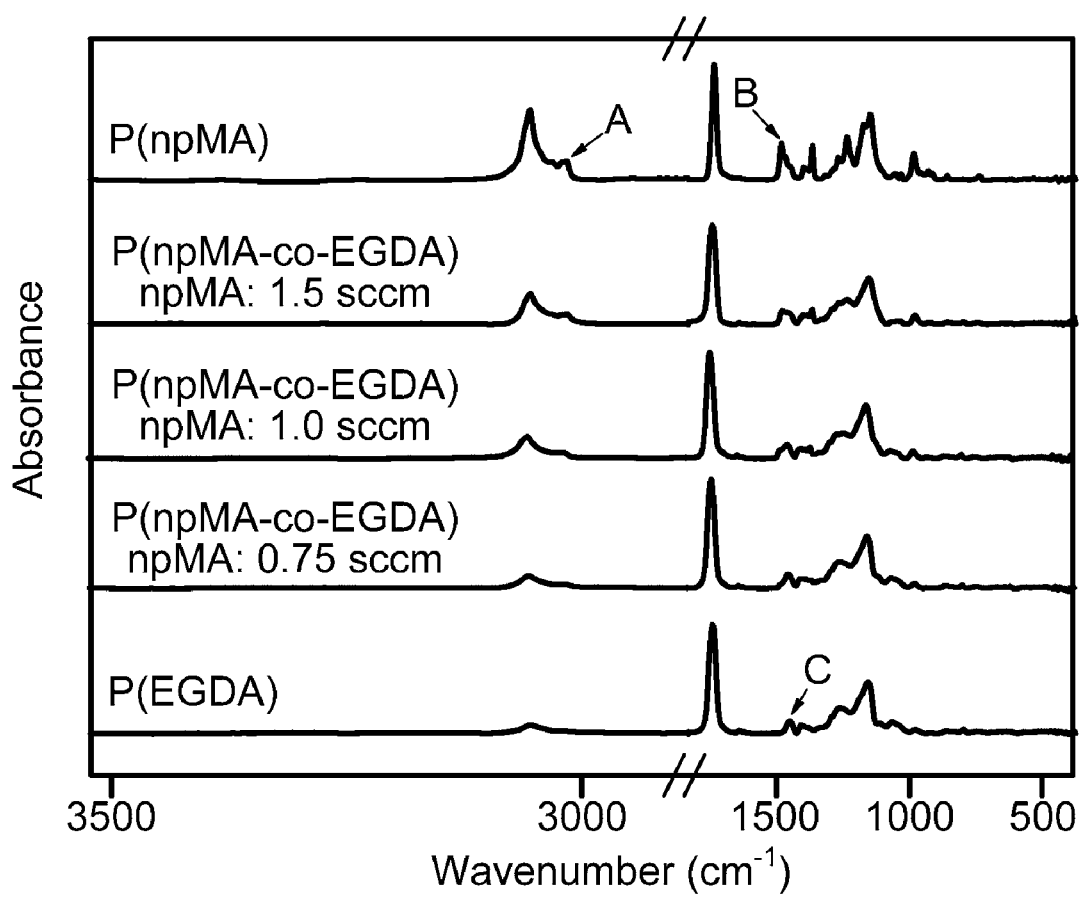
FIG. 9 provides FTIR spectra for various material films.

FIG. 8 shows the FTIR spectra of a commercial P(npMA) spun-cast film and the iCVD-synthesized P(npMA). The commercial sample was synthesized via a conventional free-radical polymerization pathway. The peak positions and relative intensities of the iCVD P(npMA) are essentially the same as the commercial intensities as shown in FIG. 8, and confirms that polymerization of npMA by iCVD methodology resulted in a similar product. FIG. 9 shows the systematic change in the intensities of these peaks in accordance with the increase in the flow rate of npMA. As the flow rate of npMA increased, the intensity of 1480 cm$^{-1}$ peak increased accordingly.

According to another example, the thicknesses of P(npMA-co-EGDA) copolymer thin films before and after interferometric thermal stability (ITS) experiments were measured by ellipsometry in the range of 315 to 700 nm. In ITS measurements, ITS response curves are acquired during thermal degradation of the polymer thin films. The ITS response curve includes interferometric laser signal data recorded as a function of temperature and time.

The original thickness of all samples was controlled at 1350±50 nm during the iCVD process. The removal percentage was calculated by dividing the difference in thicknesses before and after ITS experiments by the original thickness, and then multiplying by 100. Table 2 lists the onset temperature of degradation and the removal percentage for five copolymer films.

the generation and propagation of radicals are suppressed. Therefore, the copolymer thin film became more thermally stable as the amount of EGDA increases.

TABLE 3

| Flow rate npMA (sccm) | Young's Modulus (Gpa) | Standard Deviation of Modulus (Gpa) | Hardness (Gpa) | Standard Deviation of Hardness (Gpa) |
|---|---|---|---|---|
| 0.75 | 4.93-5.37 | 0.122 | 0.67-0.73 | 0.019 |
| 1 | 4.79-5.28 | 0.108 | 0.53-0.57 | 0.014 |
| 1.25 | 4.38-4.88 | 0.18 | 0.48-0.53 | 0.016 |
| 1.5 | 4.35-4.81 | 0.186 | 0.44-0.51 | 0.019 |
| 1.75 | 3.97-4.60 | 0.186 | 0.39-0.47 | 0.036 |
| P (npMA) | 5.46-5.83 | 0.097 | 0.62-0.71 | 0.022 |
| P (EGDA) | 4.72-5.08 | 0.24 | 0.81-0.87 | 0.035 |

According to yet another example, nano-indentation experiments were conducted on a series of P(npMA-co-EGDA) copolymers and on homopolymers of P(npMA) and P(EGDA) to determine the values of the Young's modulus and the hardness. The modulus and hardness of P(npMA),

TABLE 2

| | Flow rate of npMA (sccm) | | | | |
|---|---|---|---|---|---|
| | 0.75 | 1 | 1.25 | 1.5 | 1.75 |
| Onset temperature of degreadation (degrees C.) | 350 | 330 | 300 | 300 | 290 |
| Removal Percentage (%) | 93.59 +/− 0.23 | 95.56 +/− 0.25 | 97.12 +/− 0.06 | 97.17 +/− 0.01 | 97.88 +/− 1.06 |
| Controlled Process Parameters | Flow rate of TBPO (sccm) | Flow rate of EGDA (sccm) | Substrate holder temperature (degrees C.) | Heating element temperature (degrees C.) | Pressure (mtorr) |
| 1.3 micron film | 0.5 | Constant | 30 | 280 | 760 |

In Table 2, a P(npMA-co-EGDA) film having a thickness of about 1.3 microns is deposited using an iCVD process, wherein the process gas comprises a monomer (npMA), a cross-linking monomer (EGDA), and an initiator (TBPO). The flow rate of npMA (sccm) is varied, while the remaining process parameters are controlled as follows: the flow rate of TBPO (initiator) is approximately 0.5 sccm; the flow rate of EGDA (cross-linking monomer) is held constant; the substrate holder temperature is approximately 30 degrees C.; the heating element temperature is approximately 280 degrees C.; and the pressure is approximately 760 mtorr. As shown in Table 2, a relative increase in the flow rate of npMA (monomer) correlates with a decrease in the onset temperature of degradation and an increase in the removal percentage.

Increasing the EGDA flow rate used for copolymer deposition was observed to enhance the thermal stability, but simultaneously reduce the removal percentage of the resultant films. The generation of secondary radicals, an intermediate if EGDA follows the monomer-unzipping mechanism, is energetically unfavorable compared to methacrylate monomers due to the reduced ability of delocalizing a radical center for acrylates (even though acrylates will eventually unzip under more rigorous conditions). However under these annealing conditions, other chemical bonds in polymers are also likely to rupture and therefore the thermal products of polyacrylates consist of fragments, monomers and oligomers. The extensive cross-links and the random arrangement of npMA and EGDA moieties also prevents the unzipping of the former in that segmental motion is severely retarded and P(EGDA), and P(npMA-co-EGDA) are listed in Table 3. The standard deviation for both mechanical properties are small compared to the measured values (<5%), implying the uniformity of the deposition.

As shown Table 3, the Young's moduli of the copolymers gradually decrease as the content of npMA in P(npMA-co-EGDA) increases, which is expected since the polymer matrices become less restricted and more mobile to external forces when the cross-linking densities decrease. Furthermore, as shown in Table 3, the values of hardness show the same trend (i.e., a gradual decrease in value with an increased content of npMA). For comparison, the Young's modulus and the hardness of PMMA obtained from a bulk mechanical test are 3.3 GPa and 0.195 GPa, respectively. The cross-linked copolymers are expected to be superior to linear PMMA in mechanical properties and indeed they are. However, the cross-linked copolymers exhibit mechanical properties that are marginally less than homopolymers of P(npMA) and P(EGDA).

Furthermore, P(npMA-co-EGDA) films may be deposited using iCVD, as described above, and may comprise a decomposable material having a thermal expansion coefficient less than or equal to 40 ppm/K. Further yet, P(npMA-co-EGDA) films may be deposited using iCVD, as described above, and may comprise a decomposable material having a dielectric constant less than or equal to 6.

According to an example, for preparation of a capping layer, a Si-containing material and, in particular, an organosilicate glass (OSG), is deposited using a CVD method as described above, referred to in these examples as a filament-assisted CVD (FACVD) method. In the exemplary FACVD method, the Si-containing chemical precursor comprises DEMS introduced to a flow of helium (He), and the process conditions are as follows: a Si-containing chemical precursor flow rate of about 100 mg/min (milligrams per minute); a carrier gas flow rate of about 25 sccm (standard cubic centimeters per minute); a heat source temperature (i.e., for the heating element) ranging from about 959 degrees C. to about 1020 degrees C.; a pressure of about 6 torr; a substrate holder temperature of about 278 degrees C. to about 294 degrees C.; and a distance between the heat source and the substrate of about 50.8 mm (millimeters).

Figure 10A:
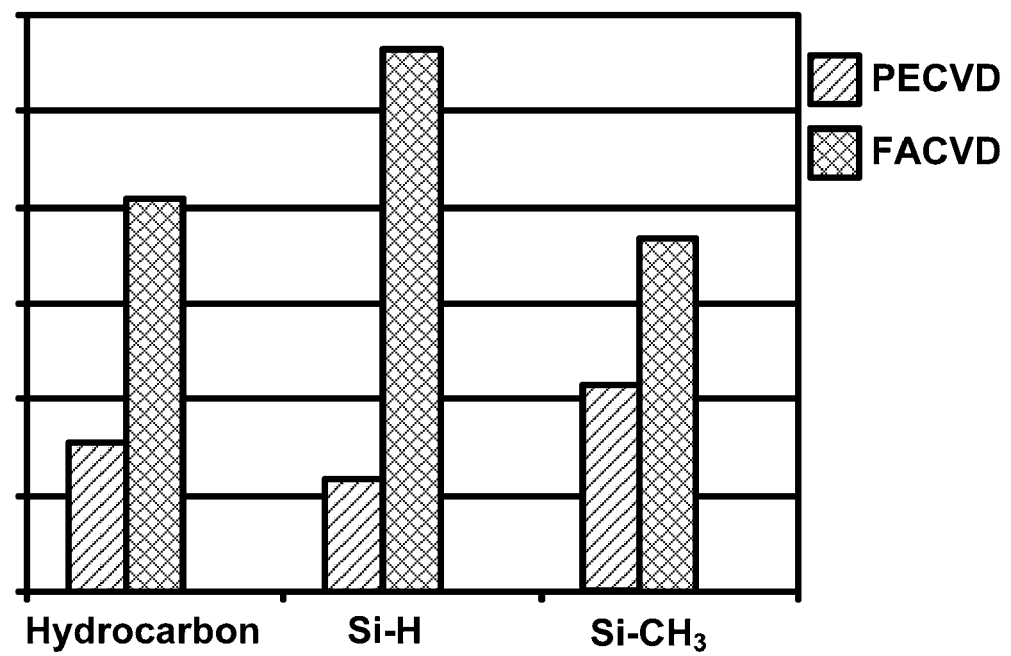
FIGS. 10A and 10B provide exemplary data for depositing a Si-containing film.

In FIG. 10A, the FACVD-deposited Si-containing material is compared to a conventional PECVD-deposited Si-containing material. In particular, the relative amount of hydrocarbon, Si—H bonds, and SiCH$_3$ bonds are provided for both the FACVD-deposited material and the PECVD-deposited material.

Figure 10B:
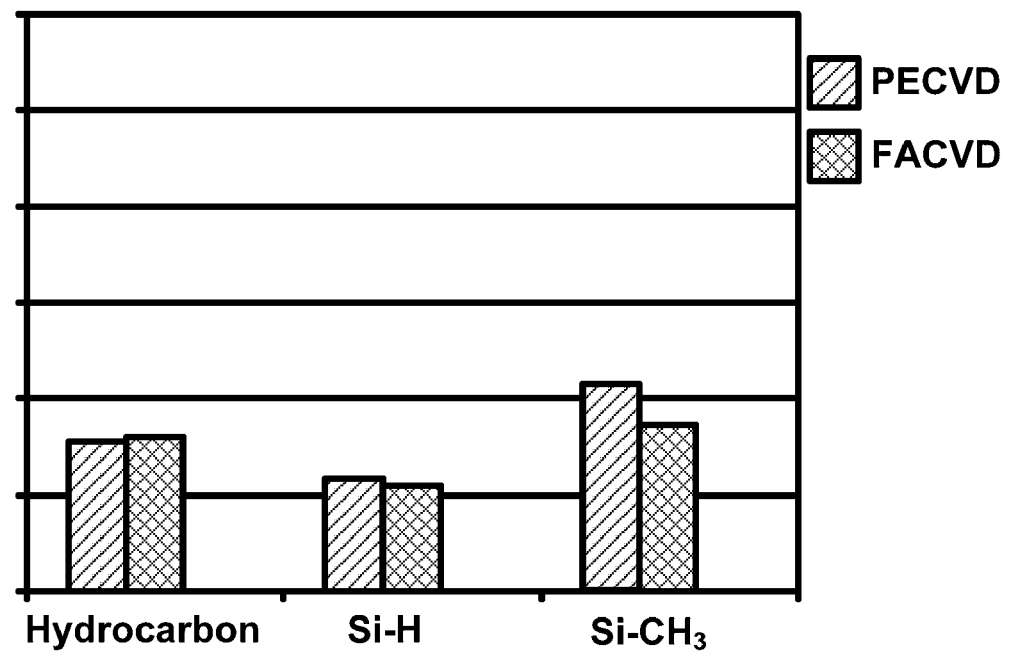

Referring now to FIG. 10B, the FACVD-deposited Si-containing material is compared to the conventional PECVD-deposited Si-containing material following curing of the FACVD-deposited material. During the curing process, the FACVD-deposited material is exposed to ultraviolet (UV) radiation for about 2 minutes. As evident in FIG. 10B, the chemical composition of the FACVD-deposited material and the PECVD-deposited material are similar.

Figure 11:
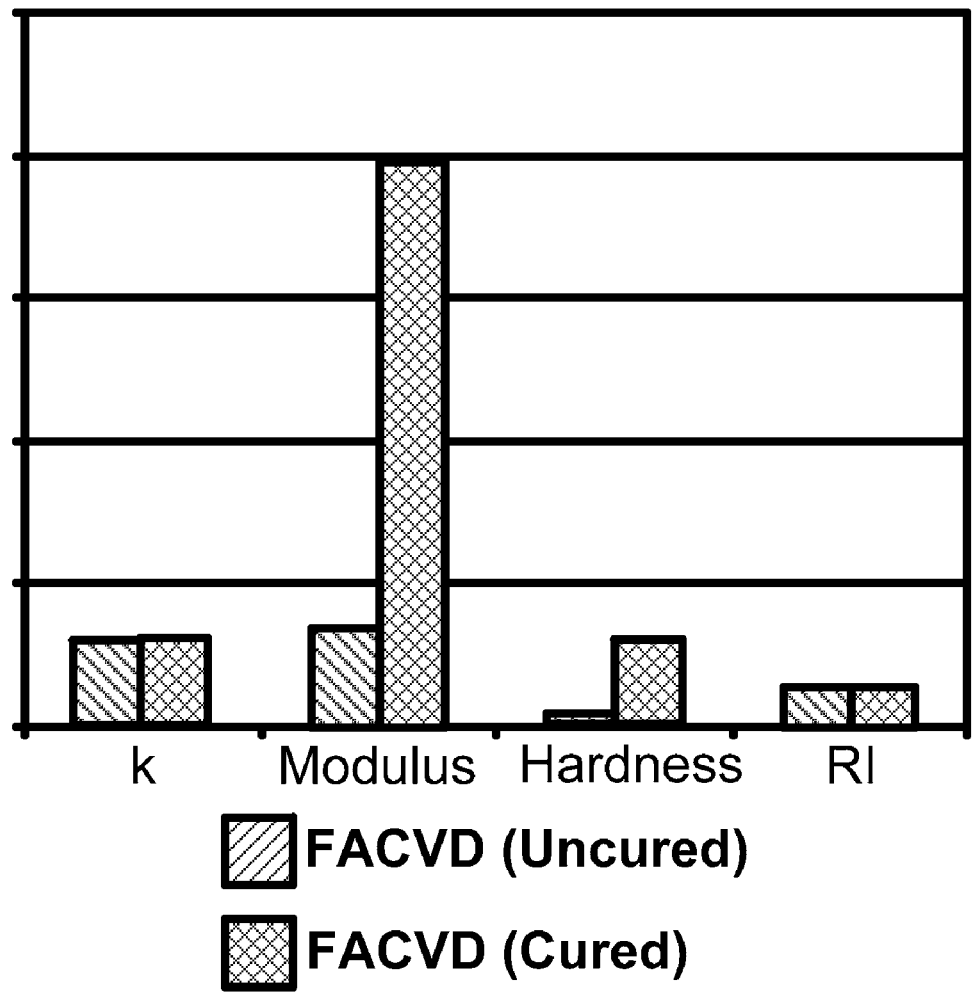
FIG. 11 provides exemplary data for depositing a Si-containing material.

Referring now to FIG. 11, several film properties are compared for the uncured FACVD-deposited material and the cured FACVD-deposited material. In particular, the dielectric constant (k), the modulus (E), the hardness (H), and the refractive index (RI) are provided. As evident in FIG. 7, the curing process has a dramatic effect on the mechanical properties of the film, wherein both the modulus and the hardness are significantly increased.

Figure 12:
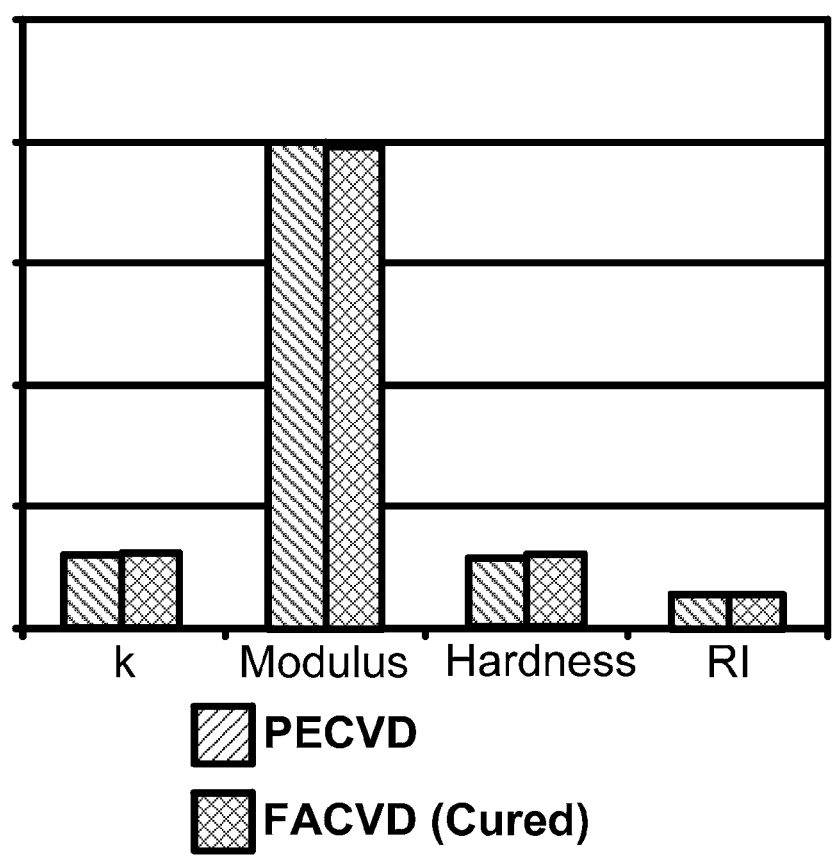
FIG. 12 provides exemplary data for depositing a Si-containing material.

Referring now to FIG. 12, these film properties are compared between the PECVD-deposited material and the cured FACVD-deposited material. As evident in FIG. 12, the measured values for k, E, H, and RI are similar for both the PECVD-deposited material and the cured FACVD-deposited material.

According to another example, for preparation of a capping layer, a Si-containing material and, in particular, an organosilicate glass (OSG), is deposited using a FACVD method as described above. In the exemplary FACVD method, the Si-containing chemical precursor comprises methyltriethoxysilane (MTES) and the porogen comprises para-cymene (PCM) introduced to a flow of helium (He), and the process conditions are as follows: a Si-containing chemical precursor flow rate of about 30 mg/min (milligrams per minute) to about 100 mg/min; a porogen flow rate of about 70 mg/min to about 300 mg/min; a carrier gas flow rate of about 25 sccm (standard cubic centimeters per minute) to about 100 sccm; a heat source temperature (i.e., for a Ta heating element) ranging from about 499 degrees C to about 952 degrees C.; a pressure of about 6 torr to about 10 torr; a substrate holder temperature of about 61 degrees C. to about 221 degrees C.; and a distance between the heat source and the substrate of about 19 mm (millimeters) to about 57 mm.

According to yet another example, for preparation of a capping layer, a Si-containing material and, in particular, an organosilicate glass (OSG), is deposited using a filament-assisted CVD process (FACVD) as described above. In the exemplary FACVD process, the Si-containing chemical precursor comprises methyltriethoxysilane and the porogen comprises para-cymene introduced to a flow of helium (He), and the process conditions are as follows: a Si-containing chemical precursor flow rate of about 30 mg/min (milligrams per minute) to about 100 mg/min; a porogen flow rate of about 70 mg/min to about 300 mg/min; a carrier gas flow rate of about 25 sccm (standard cubic centimeters per minute) to about 50 sccm; a heat source temperature (i.e., for a Ni—Cr alloy (e.g., Nichrome®) heating element) ranging from about 715 degrees C. to about 895 degrees C.; a pressure of about 4 torr to about 12 torr; a substrate holder temperature of about 61 degrees C. to about 198 degrees C.; and a distance between the heat source and the substrate of about 19 mm (millimeters) to about 44 mm.

Table 4 illustrates a comparison of film properties between cured FACVD-deposited material using DEMS and cured FACVD-deposited material using MTES/PCM.

TABLE 4

| Chemical precursor | k | E (Gpa) | H (Gpa) |
|---|---|---|---|
| DEMS | 2.4 | 6.5 | 1.2 |
| MTES/PCM | 2.27 | 6.1 | 0.89 |

As evident in Table 4, the measured values for k, E, and H are similar for both cured FACVD-deposited materials; however, marginally lower dielectric constant (k) for MTES/PCM.

The pressure and carrier gas dilution (e.g., He) may be used to alter film morphology and film shrinkage. For example, lower pressure and lower dilution (i.e., lower carrier gas flow rate) tend to improve film morphology. Furthermore, lower pressure and a Nichrome heating element (relative to a Ta heating element) tend to favor reduced film shrinkage following curing.

Figure 13:
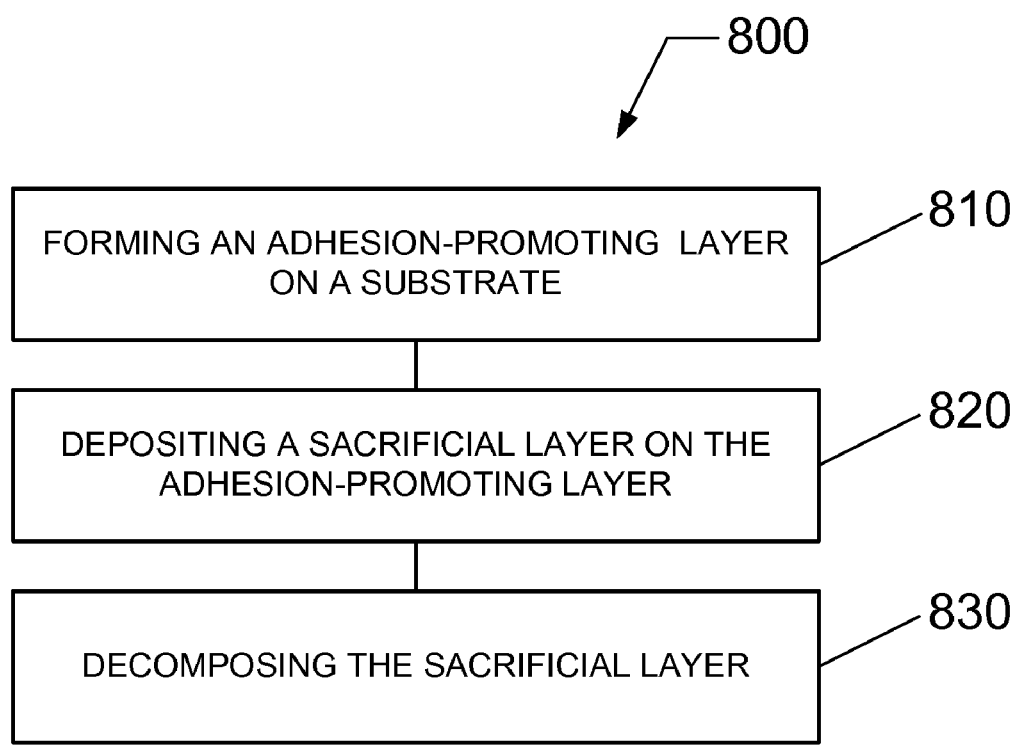
FIG. 13 is a flow chart of a method of forming a sacrificial layer according to another embodiment.

Referring now to FIG. 13, a method for forming a sacrificial layer on a substrate is described according to yet another embodiment. For example, the sacrificial layer may be used in an air gap structure. The method includes a flow chart 800 beginning in 810 with forming an adhesion-promoting layer on a substrate. In 820, a sacrificial layer is deposited on the adhesion-promoting layer.

In one embodiment, the formation of the adhesion-promoting layer may comprise depositing a thin material layer to improve adhesion between the sacrificial layer and the underlying substrate. For example, a Si-containing material, or an organic material, or a mixture of a Si-containing material and an organic material may be deposited on the substrate. The deposition of the adhesion-promoting layer may include using a spin coating process, or a vapor deposition process, such as a CVD process, a PECVD process, an iCVD process as described in greater detail above, or an FACVD process as described in greater detail above. Other processes may include a pyrolytic CVD process or a hot-filament CVD (HFCVD) process. The vapor deposition process may utilize one or more chemical precursors, such as a Si-containing chemical precursor, or an organic chemical precursor, or a mixture thereof. The Si-containing precursor may include a silane, a siloxane, or any one of the Si-containing chemical precursors identified above. The organic chemical precursor may include any one of the organic chemical precursors identified above. For instance, the adhesion-promoting layer may include a layer of FACVD-deposited trivinylmethyl silane.

In another embodiment, the formation of the adhesion-promoting layer may comprise growing a thin material layer to improve adhesion between the sacrificial layer and the underlying substrate. For example, the substrate may be exposed to an oxygen-containing environment, a nitrogen-containing environment, or a carbon-containing environment, or a combination thereof to oxidize, nitridize, or carbidize a surface layer of the substrate, respectively. The substrate may be exposed to other materials as well. During the growth of the adhesion-promoting layer, the substrate temperature may be elevated. The substrate may be placed upon a heated pedestal in a process chamber, or placed in a substrate boat within a furnace, wherein the heated substrate is exposed to one of the processing environments described above. For instance, the substrate may be exposed to an $O_2$ in a furnace.

In another embodiment, the formation of the adhesion-promoting layer may comprise chemically treating the substrate to adsorb a thin layer onto the substrate or chemically alter the substrate to improve adhesion between the sacrificial layer and the underlying substrate. The substrate may be exposed to a vapor-phase or liquid-phase chemical source. The chemical source may include a Si-containing material, such as a silane, a siloxane, or any one of the Si-containing chemical precursors identified above. For instance, the substrate may be exposed to a Si-containing material having a vinyl group, such as trichlorovinyl silane, or vinyltriethoxysilane.

In another embodiment, the formation of the adhesion-promoting layer may comprise introducing material to a surface layer of the substrate using ion implant or gas cluster ion beam processing.

In another embodiment, the formation of the adhesion-promoting layer may comprise thermal treatment of the substrate. The thermal treatment of the substrate may proceed before, during, and/or after any one of the processes described above for forming the adhesion-promoting layer.

In yet another embodiment, the formation of the adhesion-promoting layer may include any combination of the processes described above.

The sacrificial layer may include an organic material, a polymer, a homopolymer, or copolymer. For example, the sacrificial layer may comprise a cross-linked organic glass. Additionally, for example, the sacrificial layer may comprise a polymer film selected from the group consisting of P(npMA-co-EGDA), P(npMA-co-EGDMA), P(CPMA-co-EGDA), and P(CPMA-co-EGDMA). Additionally, for example, the sacrificial layer may comprise EGDA, or EGDMA. Additionally yet, for example, the sacrificial layer may comprise a methacrylate organic glass. Furthermore, for example, the sacrificial layer may comprise a cyclopentyl methacrylate organic glass or a neopentyl methacrylate organic glass. Further yet, for example, the sacrificial layer may comprise para-cymene, para-ethyltoluene, 2,5-dimethyl-2,4-hexadiene, cyclohexene oxide, or alpha terpinene.

The sacrificial layer may be formed using a vapor deposition process, such as a CVD process, a PECVD process, an iCVD process as described in greater detail above, or an FACVD process as described in greater detail above. Other processes may include a pyrolytic CVD process or a hot-filament CVD (HFCVD) process.

Thereafter, in 830, the sacrificial layer is decomposed by exposing the substrate to ultraviolet (UV) radiation. The decomposition of the sacrificial layer may further comprise heating the substrate before, during, or after the UV exposure. The use of UV exposure can facilitate decomposition of the sacrificial material at a temperature less than the temperature required to thermally decompose the sacrificial layer. The temperature required to thermally decompose the sacrificial layer can vary depending upon the chemical composition of the sacrificial layer, and the dimensions of the sacrificial layer. For example, Table 4 provides the onset temperature for degradation of several sacrificial materials when subjected to thermal decomposition without UV exposure. A UV-assisted decomposition process is more efficient in energy transfer, as compared to purely thermal decomposition processes, and the higher energy levels found in the form of energetic photons can facilitate the decomposition of a sacrificial material at a temperature less than its thermal decomposition temperature.

The exposure of the sacrificial layer to UV radiation may include exposing these layers to UV radiation from one or more UV lamps, one or more UV LEDs (light emitting diodes), or one or more UV lasers, or a combination of two or more thereof. The wavelength of the UV radiation may be less than or equal to approximately 350 nm. Desirably, the UV radiation may range in wavelength from approximately 150 nm to approximately 350 nm and, more desirably, the UV radiation may range in wavelength from approximately 170 nm to approximately 320 nm or from approximately 170 nm to approximately 240 nm).

During the exposure of the sacrificial layer to UV radiation, these layers may be thermally treated by elevating the temperature of the substrate to a UV-assisted decomposition temperature less than the temperature required to thermally decompose the sacrificial layer in the absence of UV radiation. The thermal decomposition temperature may be greater than or equal to 350 degrees C., or it may be greater than approximately 375 degrees C. Alternatively, the thermal decomposition temperature may be greater than or equal to approximately 400 degrees C., or it may be greater than approximately 425 degrees C. The UV-assisted decomposition temperature is selected to be less than the thermal decomposition temperature. For example, the UV-assisted decomposition temperature may be less than or equal to approximately 375 degrees C., or it may be less than or equal to approximately 350 degrees C. Alternatively, for example, the UV-assisted decomposition temperature may be less than or equal to approximately 325 degrees C., or it may be less than or equal to approximately 300 degrees C.

Optionally, during the exposure of the sacrificial layer to UV radiation, the sacrificial layer may be exposed to infrared (IR) radiation. The exposure of the sacrificial layer to IR radiation may include exposing these layers to IR radiation from one or more IR lamps, one or more IR LEDs, or one or more IR lasers, or a combination of two or more thereof. The IR radiation may range in wavelength from approximately 1 micron to approximately 25 microns. Desirably, the IR radiation may range in wavelength from approximately 8 microns to approximately 14 microns.

When preparing an air gap structure, a capping layer may be formed over the sacrificial layer. Upon decomposition and removal of the sacrificial layer, the capping layer may bridge the remaining air gap or void. The capping layer may comprise a low-k dielectric material or an ultra-low-k (ULK) dielectric material. Furthermore, the cap layer may comprise a porous ULK dielectric material.

Figure 14:
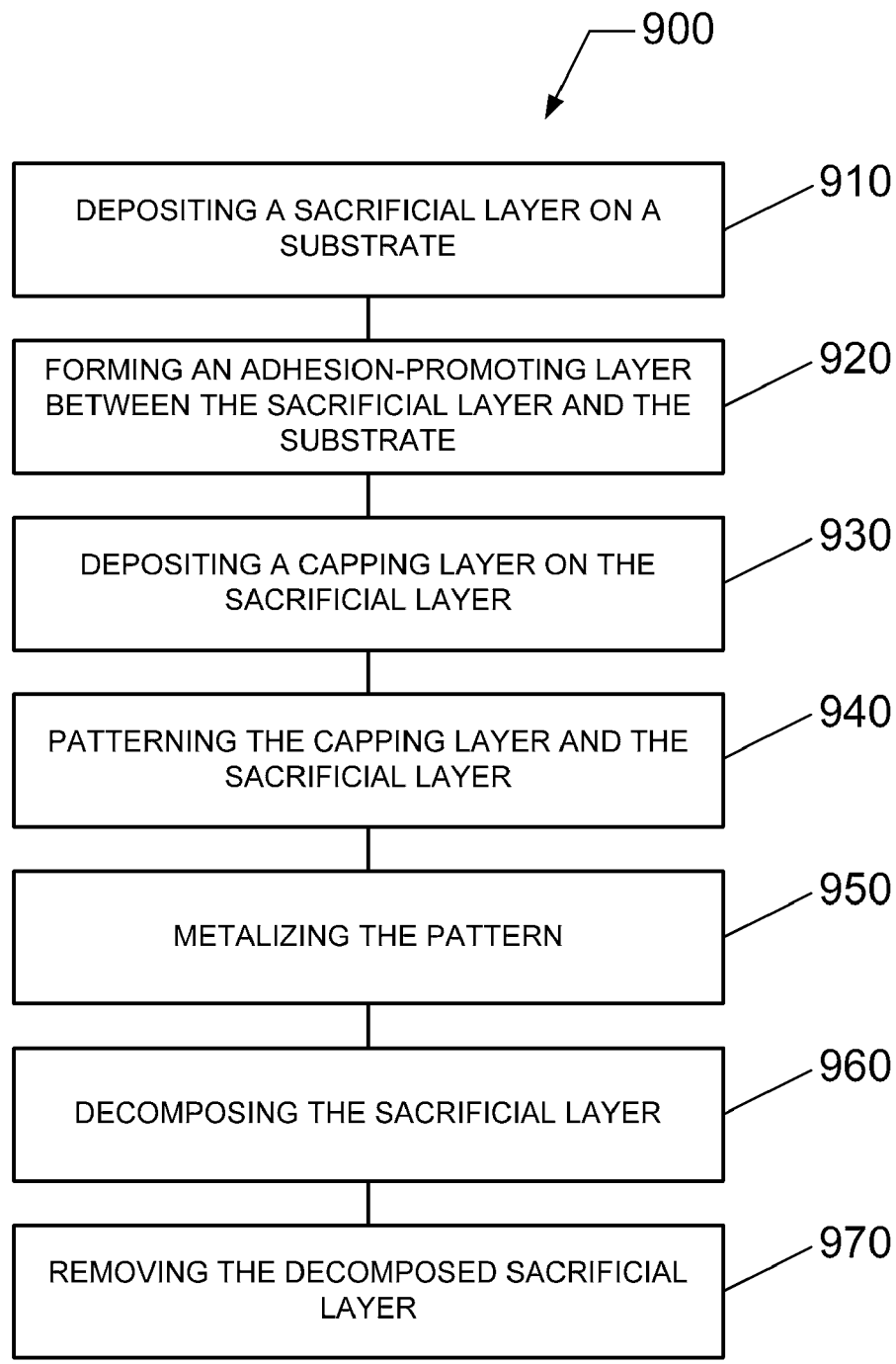
FIG. 14 is a flow chart of a method of forming an air gap structure according to yet another embodiment.

Referring now to FIG. 14, a method for forming an air gap structure is described according to yet another embodiment. The method includes a flow chart 900 beginning in 910 with depositing a sacrificial layer on a substrate. In 920, an adhesion-promoting layer is formed between the sacrificial layer and the substrate and, in 930, a capping layer is deposited on the sacrificial layer. Optionally, another adhesion-promoting layer is formed between the sacrificial layer and the capping layer.

The sacrificial layer may include an organic material, a polymer, a homopolymer, or a copolymer. For example, the sacrificial layer may comprise a cross-linked organic glass. Additionally, for example, the sacrificial layer may comprise a polymer film selected from the group consisting of P(npMA-co-EGDA), P(npMA-co-EGDMA), P(CPMA-co-EGDA), and P(CPMA-co-EGDMA). Additionally, for example, the sacrificial layer may comprise EGDA, or EGDMA. Additionally yet, for example, the sacrificial layer may comprise a methacrylate organic glass. Furthermore, for example, the sacrificial layer may comprise a cyclopentyl methacrylate organic glass or a neopentyl methacrylate organic glass. Further yet, for example, the sacrificial layer may comprise para-cymene, para-ethyltoluene, 2,5-dimethyl-2,4-hexadiene, cyclohexene oxide, or alpha terpinene.

The sacrificial layer may be formed using a vapor deposition process, such as a CVD process, a PECVD process, an iCVD process as described in greater detail above, or an FACVD process as described in greater detail above. Other processes may include a pyrolytic CVD process or a hot-filament CVD (HFCVD) process.

The capping layer may be described as a low dielectric constant (low-k) film or an ultra low-k film. The capping layer may have a dielectric constant value (before drying and/or curing, or after drying and/or curing, or both) equal to or less than the dielectric constant of $SiO_2$, which is approximately 4 (e.g., the dielectric constant for thermal silicon dioxide can range from 3.8 to 3.9). In various embodiments of the invention, the capping layer may have a dielectric constant (before drying and/or curing, or after drying and/or curing, or both) of less than 3.0, a dielectric constant of less than 2.5, or a dielectric constant ranging from 1.6 to 2.7. The capping layer may include a porous dielectric film, or it may include a non-porous dielectric film. However, in the latter, the capping layer should allow the removal of the sacrificial layer during decomposition. For instance, if the capping layer includes a non-porous material, then one or more openings may be formed to permit the passage of the decomposed sacrificial material. As an example, the capping layer may include a dual phase porous low-k film. The dielectric constant of the capping layer may have a higher dielectric constant prior to porogen burn-out than following porogen burn-out.

The capping layer may be formed using a vapor deposition process, such as a CVD process, a PECVD process, an iCVD process as described in greater detail above, or an FACVD process as described in greater detail above. Other processes may include a pyrolytic CVD process or a hot-filament CVD (HFCVD) process.

Also, the capping layer can be formed using spin-on dielectric (SOD) techniques such as those offered in the Clean Track ACT 8 SOD and ACT 12 SOD coating systems commercially available from Tokyo Electron Limited (TEL). The Clean Track ACT 8 (200 mm) and ACT 12 (300 mm) coating systems provide coat, bake, and cure tools for SOD materials. The track system can be configured for processing substrate sizes of 100 mm, 200 mm, 300 mm, and greater. Other systems and methods for forming a dielectric film on a substrate as known to those skilled in the art of both spin-on dielectric technology and CVD dielectric technology are suitable for the invention.

As described above, the capping layer may be characterized as a low dielectric constant (or low-k) dielectric film. The capping layer may include at least one of an organic, inorganic, and inorganic-organic hybrid material. Additionally, the capping layer may be porous or non-porous. For example, the capping layer may comprise a Si-containing material. Additionally, for example, the capping layer may include an inorganic, silicate-based material, such as oxidized organosilane (or organo siloxane), deposited using CVD techniques. Examples of such films include Black Diamond™ CVD organosilicate glass (OSG) films commercially available from Applied Materials, Inc., or Coral™ CVD films commercially available from Novellus Systems. Additionally, for example, the capping layer can include single-phase materials, such as a silicon oxide-based matrix having terminal organic side groups that inhibit cross-linking during a curing process to create small voids (or pores). Additionally, for example, the capping layer can include dual-phase materials, such as a silicon oxide-based matrix having inclusions of organic material (e.g., a porogen) that is decomposed and evaporated during a curing process. Alternatively, the capping layer may include an inorganic, silicate-based material, such as hydrogen silsesquioxane (HSQ) or methyl silsesquioxane (MSQ), deposited using SOD techniques. Examples of such films include FOx HSQ commercially available from Dow Corning, XLK porous HSQ commercially available from Dow Corning, and JSR LKD-5109 commercially available from JSR Microelectronics. Still alternatively, the capping layer can include an organic material deposited using SOD techniques. Examples of such films include SiLK-I, SiLK-J, SiLK-H, SiLK-D, porous SiLK-T, porous SiLK-Y, and porous SiLK-Z semiconductor dielectric resins commercially available from Dow Chemical, and FLARE™, and Nano-glass commercially available from Honeywell.

In one embodiment, the formation of the adhesion-promoting layer, between the sacrificial layer and the substrate and/or between the sacrificial layer and the capping layer, may comprise depositing a thin material layer to improve adhesion between the sacrificial layer and the underlying substrate. For example, a Si-containing material, or an organic material, or a mixture of a Si-containing material and an organic material may be deposited on the substrate. The deposition of the adhesion-promoting layer may include using a spin coating process, or a vapor deposition process, such as a CVD process, a PECVD process, an iCVD process as described in greater detail above, or an FACVD process as described in greater detail above. Other processes may include a pyrolytic CVD process or a hot-filament CVD (HFCVD) process. The vapor deposition process may utilize one or more chemical precursors, such as a Si-containing chemical precursor, or an organic chemical precursor, or a mixture thereof. The Si-containing precursor may include a silane, a siloxane, or any one of the Si-containing chemical precursors identified above. The organic chemical precursor may include any one of the organic chemical precursors identified above. For instance, the adhesion-promoting layer may include a layer of FACVD-deposited trivinylmethyl silane.

In another embodiment, the formation of the adhesion-promoting layer, between the sacrificial layer and the substrate and/or between the sacrificial layer and the capping layer, may comprise growing a thin material layer to improve adhesion between the sacrificial layer and the underlying substrate. For example, the substrate may be exposed to an oxygen-containing environment, a nitrogen-containing environment, or a carbon-containing environment, or a combination thereof to oxidize, nitridize, or carbidize a surface layer of the substrate, respectively. The substrate may be exposed to other materials as well. During the growth of the adhesion-promoting layer, the substrate temperature may be elevated. The substrate may be placed upon a heated pedestal in a process chamber, or placed in a substrate boat within a furnace, wherein the heated substrate is exposed to one of the processing environments described above. For instance, the substrate may be exposed to an $O_2$ in a furnace.

In another embodiment, the formation of the adhesion-promoting layer, between the sacrificial layer and the substrate and/or between the sacrificial layer and the capping layer, may comprise chemically treating the substrate to adsorb a thin layer onto the substrate or chemically alter the substrate to improve adhesion between the sacrificial layer and the underlying substrate. The substrate may be exposed to a vapor-phase or liquid-phase chemical source. The chemical source may include a Si-containing material, such as a silane, a siloxane, or any one of the Si-containing chemical precursors identified above. For instance, the substrate may be exposed to a Si-containing material having a vinyl group, such as trichlorovinyl silane, or vinyltriethoxysilane.

In another embodiment, the formation of the adhesion-promoting layer, between the sacrificial layer and the substrate and/or between the sacrificial layer and the capping layer, may comprise introducing material to a surface layer of the substrate using ion implant or gas cluster ion beam processing.

In another embodiment, the formation of the adhesion-promoting layer, between the sacrificial layer and the substrate and/or between the sacrificial layer and the capping layer, may comprise thermal treatment of the substrate. The thermal treatment of the substrate may proceed before, during, and/or after any one of the processes described above for forming the adhesion-promoting layer.

In yet another embodiment, the formation of the adhesion-promoting layer, between the sacrificial layer and the substrate and/or between the sacrificial layer and the capping layer, may include any combination of the processes described above.

In one embodiment, prior to depositing the capping layer, the sacrificial layer may be treated to improve one or more material properties of the sacrificial layer. In another embodiment, prior to forming the lithographic structure, the sacrificial layer and/or the capping layer may be treated to improve one or more material properties of the sacrificial layer and/or capping layer. The one or more material properties may include mechanical properties (e.g., Young's modulus, hardness, etc.), or thermal properties (e.g., thermal stability, etc.), or a combination thereof. As an example, thermal stabilization of the sacrificial layer prior to capping layer formation may reduce film shrinkage during the deposition of the capping layer.

The treatment of the sacrificial layer and/or capping layer may include exposing the sacrificial layer and/or capping layer to an energy source. The energy source may comprise a coherent source of electro-magnetic radiation, such as a laser, or a non-coherent source of electro-magnetic radiation, such as a lamp, or both. Additionally, the energy source may comprise a photon source, an electron source, a plasma source, a microwave radiation source, an ultraviolet (UV) radiation source, an infrared (IR) radiation source, a visible radiation source, or a thermal energy source, or any combination of two or more thereof.

Thereafter, in 940, the capping layer and the sacrificial layer are patterned. During patterning, a lithographic structure is formed on the capping layer, wherein the lithographic structure comprises one or more layers with a pattern formed therein. For example, the lithographic structure may comprise forming a mask layer on the substrate and patterning the mask layer using a lithographic process. The patterned mask layer may be formed by coating the substrate with a layer of radiation-sensitive material, such as photo-resist. For example, photo-resist may be applied to the substrate using a spin coating technique, such as those processes facilitated by a track system. Additionally, for example, the photo-resist layer is exposed to an image pattern using a photo-lithography system or electron beam lithography system, and thereafter, the image pattern is developed in a developing composition to form the pattern in the photo-resist layer.

The layer of radiation-sensitive material may comprise 248 nm (nanometer) resists, 193 nm resists, 157 nm resists, EUV (extreme ultraviolet) resists, or e-beam resists. The layer of radiation-sensitive material can be formed using a track system. For example, the track system can comprise a Clean Track ACT 8, ACT 12, or Lithius resist coating and developing system commercially available from Tokyo Electron Limited (TEL). Other systems and methods for forming a photo-resist film on a substrate are well known to those skilled in the art of spin-on resist technology.

The exposure to electromagnetic (EM) radiation may be performed in a dry or wet photo-lithography system, or an electron beam lithography system. The image pattern can be formed using any suitable conventional stepping lithographic system, or scanning lithographic system. For example, the photo-lithographic system may be commercially available from ASML Netherlands B.V. (De Run 6501, 5504 DR Veldhoven, The Netherlands), or Canon USA, Inc., Semiconductor Equipment Division (3300 North First Street, San Jose, Calif. 95134).

The developing process can include exposing the substrate to a developing solvent in a developing system, such as a track system. For example, the track system can comprise a Clean Track ACT 8, ACT 12, or Lithius resist coating and developing system commercially available from Tokyo Electron Limited (TEL).

The pattern formed in the lithographic structure is transferred to the capping layer and the sacrificial layer. For example, the pattern transfer process may include a dry etching process, or a wet etching process. Additionally, for example, the etching process may include a dry plasma etching process, or dry non-plasma etching process.

The formation of the pattern in the lithographic structure and the transfer of the pattern to one or more underlying layers would be understood by one skilled in the art of preparing and using a lithographic mask, with or without one or more soft mask layers or hard mask layers, to etch the pattern into the one or more underlying layers, including the capping layer and the sacrificial layer, to form the pattern or structure in these layers.

The formation of the pattern in the lithographic structure and the transfer of the pattern to one or more underlying layers may be performed to create any feature within the capping layer and sacrificial layer including, but not limited to, an interconnect structure, a trench, a contact, a via, etc.

As illustrated in FIGS. 1A through 1E, the formation of the pattern in the lithographic structure and the transfer of the pattern to one or more underlying layers may be performed to pursue single damascene integration. Alternatively, the formation of the pattern in the lithographic structure and the transfer of the pattern to one or more underlying layers may be performed to pursue dual damascene integration, wherein the air gap structure extends through only the trench level interconnect layer (trench level dielectric layer and metal line(s)) or only the via level interconnect layer (via level dielectric layer and metal via(s)/contact(s)). For example, in the former case, the air gap structure may extend through only the trench level interconnect layer. Therein, an adhesion-promoting layer is formed on the via level dielectric layer, the sacrificial layer is formed on the adhesion-promoting layer, and the capping layer is formed on the sacrificial layer. The via patterning step may extend through each of these layers, while the trench patterning step stops on the via level dielectric layer.

Alternatively yet, the formation of the pattern in the lithographic structure and the transfer of the pattern to one or more underlying layers may be performed to pursue dual damascene integration, wherein the air gap structure extends through the trench level dielectric layer and the via level dielectric layer. Therein, one or more lithographic structures may be prepared to form a trench pattern and a via pattern in the one or more underlying layers. Further, the one or more underlying layers may comprise a first sacrificial layer, a first capping layer formed on the first sacrificial layer, a second sacrificial layer formed on the first capping layer, and a second capping layer formed on the second sacrificial layer. The via patterning step may extend through each of these layers, while the trench patterning step stops on the first capping layer. Alternatively, the first capping layer is excluded.

Thereafter, the lithographic structure is removed. For example, the lithographic structure may be removed using a wet stripping process, a dry plasma ashing process, or a dry non-plasma ashing process.

In 950, the pattern is metalized, wherein at least a portion of the capping layer is exposed. The metalization process may include conformally depositing a barrier layer on the substrate, filling the pattern or structure with metal, performing a pre-planarization anneal process, and planarizing the metalized structure to the capping layer in order to expose the capping layer. Additionally, the metallization process may include cleaning the planarized, metalized structure, and forming another barrier layer on the planarized, metalized structure to cap the planarized, metalized structure. For example, the metallization process may include a damascene process, or a dual damascene process.

In 960, the patterned sacrificial layer is decomposed by exposing the substrate to ultraviolet (UV) radiation and heating the substrate.

In 970, the decomposed sacrificial layer is removed through the capping layer.

The sacrificial layer is decomposed by exposing the substrate to ultraviolet (UV) radiation. The decomposition of the sacrificial layer may further comprise heating the substrate before, during, or after the UV exposure. The use of UV exposure can facilitate decomposition of the sacrificial material at a temperature less than the temperature required to thermally decompose the sacrificial layer. The temperature required to thermally decompose the sacrificial layer can vary depending upon the chemical composition of the sacrificial layer, and the dimensions of the sacrificial layer. For example, Table 4 provides the onset temperature for degradation of several sacrificial materials when subjected to thermal decomposition without UV exposure. A UV-assisted decomposition process is more efficient in energy transfer, as compared to purely thermal decomposition processes, and the higher energy levels found in the form of energetic photons can facilitate the decomposition of a sacrificial material at a temperature less than its thermal decomposition temperature.

The exposure of the sacrificial layer to UV radiation may include exposing these layers to UV radiation from one or more UV lamps, one or more UV LEDs (light emitting diodes), or one or more UV lasers, or a combination of two or more thereof. The wavelength of the UV radiation may be less than or equal to approximately 350 nm. Desirably, the UV radiation may range in wavelength from approximately 150 nm to approximately 350 nm and, more desirably, the UV radiation may range in wavelength from approximately 170 nm to approximately 320 nm or from approximately 170 nm to approximately 240 nm).

During the exposure of the sacrificial layer to UV radiation, these layers may be thermally treated by elevating the temperature of the substrate to a UV-assisted decomposition temperature less than the temperature required to thermally decompose the sacrificial layer in the absence of UV radiation. The thermal decomposition temperature may be greater than or equal to 350 degrees C, or it may be greater than approximately 375 degrees C. Alternatively, the thermal decomposition temperature may be greater than or equal to approximately 400 degrees C., or it may be greater than approximately 425 degrees C. The UV-assisted decomposition temperature is selected to be less than the thermal decomposition temperature. For example, the UV-assisted decomposition temperature may be less than or equal to approximately 375 degrees C., or it may be less than or equal to approximately 350 degrees C. Alternatively, for example, the UV-assisted decomposition temperature may be less than or equal to approximately 325 degrees C., or it may be less than or equal to approximately 300 degrees C.

Optionally, during the exposure of the sacrificial layer to UV radiation, the sacrificial layer may be exposed to infrared (IR) radiation. The exposure of the sacrificial layer to IR radiation may include exposing these layers to IR radiation from one or more IR lamps, one or more IR LEDs, or one or more IR lasers, or a combination of two or more thereof. The IR radiation may range in wavelength from approximately 1 micron to approximately 25 microns. Desirably, the IR radiation may range in wavelength from approximately 8 microns to approximately 14 microns.

Additional details for preparing an air gap structure are provided in pending U.S. patent application Ser. No.11/874, 461, entitled "METHOD AND SYSTEM FOR FORMING AN AIR GAP STRUCTURE", filed on Oct. 18, 2007; the entire content of which is herein incorporated by reference in its entirety.

Although only certain exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

What is claimed is:

1. A method for forming an air gap structure, comprising:
    depositing a sacrificial layer on a substrate, said sacrificial layer comprising a decomposable material;
    forming an adhesion-promoting layer between said sacrificial layer and said substrate using a chemical vapor deposition (CVD) process that includes exposing a chemical precursor to a non-ionizing heat source to cause pyrolysis of one or more species in said chemical precursor and produce molecular fragments of said one or more species in said chemical precursor;
    depositing a capping layer over said sacrificial layer;
    patterning said capping layer and said sacrificial layer to create a pattern in said capping layer and said sacrificial layer;
    metalizing said pattern formed in said capping layer and said sacrificial layer;
    decomposing said sacrificial layer by exposing said substrate to ultraviolet (UV) radiation and heating said substrate; and
    removing said decomposed sacrificial layer through said capping layer.

2. The method of claim 1, wherein said depositing said sacrificial layer comprises depositing an organic film, a polymer film, a homopolymer film, a copolymer film, or a cross-linked organic glass.

3. The method of claim 1, wherein said depositing said sacrificial layer comprises depositing a material selected from the group consisting of P(npMA-co-EGDA), P(npMA-co-EGDMA), P(CPMA-co-EGDA), P(CPMA-co- EGDMA), EGDA, EGDMA, para-cymene, para-ethyltoluene, 2,5-dimethyl-2,4-hexadiene, cyclohexene oxide, and alpha terpinene.

4. The method of claim 1, wherein said depositing said sacrificial layer comprises performing an initiated CVD process or a filament-assisted CVD process.

5. The method of claim 1, wherein said depositing said capping layer comprises forming a non-porous dielectric layer, a porous dielectric layer, a low-k layer, or an ultra-low-k layer, or any combination of two or more thereof.

6. The method of claim 1, wherein said depositing said capping layer comprises using a plasma enhanced CVD process, an initiated CVD process, or a filament-assisted CVD process.

7. The method of claim 6, wherein said depositing said capping layer comprises forming a Si-containing layer using a Si-containing chemical precursor composed of a Si-containing structure-forming molecule and a pore-generating molecule, and wherein said pore-generating molecule is weakly bonded to said Si-containing structure-forming molecule as a side group, or said pore-generating molecule is not bonded to said Si-containing structure-forming molecule.

8. The method of claim 1, wherein said exposure of said substrate to UV radiation comprises exposing said substrate to UV radiation ranging from approximately 100 nanometers to approximately 600 nanometers.

9. The method of claim 1, wherein said exposure of said substrate to UV radiation comprises exposing said substrate to UV radiation ranging from approximately 170 nanometers to approximately 320 nanometers.

10. The method of claim 1, wherein said exposure of said substrate to UV radiation comprises a first exposure to first UV radiation to perform said decomposing and a second exposure to second UV radiation to cure said capping layer.

11. The method of claim 1, wherein said heating said substrate comprises elevating a temperature of said substrate to about 450 degrees C. or less.

12. The method of claim 1, further comprising:
exposing said sacrificial layer, or said capping layer, or both said sacrificial layer and said capping layer to infrared radiation.

13. The method of claim 1, further comprising:
forming another adhesion-promoting layer between said sacrificial layer and said capping layer.

14. The method of claim 1, wherein said forming said adhesion-promoting layer further comprises depositing a thin material layer on said substrate, growing a thin material layer on said substrate, chemically treating said substrate, thermally treating said substrate, or introducing material to said substrate, or any combination of two or more thereof.

15. The method of claim 1, wherein said forming said adhesion-promoting layer comprises depositing a Si-containing layer using a filament assisted CVD process.

16. The method of claim 1, wherein said forming said adhesion-promoting layer further comprises chemically treating said substrate and thermally treating said chemically treated substrate.

17. The method of claim 16, wherein said chemically treating said substrate comprises exposing said substrate to a silicon-containing material, and wherein said thermally treating said substrate comprises exposing said substrate to a thermal cure in an oxygen-containing environment.

18. The method of claim 1, wherein said forming said adhesion-promoting layer further comprises exposing said substrate to an oxygen-containing environment, a nitrogen-containing environment, or a carbon-containing environment, or a combination thereof to oxidize, nitridize, or carbidize a surface layer of said substrate.

19. The method of claim 1 further comprising:
treating said sacrificial layer prior to forming said capping layer to thermally stabilize said sacrificial layer.

20. The method of claim 1, further comprising:
treating said sacrificial layer and said capping layer prior to forming said lithographic structure to thermally stabilize and/or cure said sacrificial layer and said capping layer.

21. The method of claim 1, wherein said forming said adhesion-promoting layer comprises depositing a graded organosilicon-containing layer using said chemical vapor deposition (CVD) process that includes exposing a chemical precursor containing a mixture of a silicon-containing chemical precursor and an organic chemical precursor to a non-ionizing heat source to cause pyrolysis of one or more species in said chemical precursor and produce molecular fragments of said one or more species in said chemical precursor.

22. A method for forming an air gap structure, comprising:
depositing a sacrificial layer on a substrate, said sacrificial layer comprising a decomposable material;
forming an adhesion-promoting layer between said sacrificial layer and said substrate, wherein said forming said adhesion-promoting layer comprises chemically treating said substrate and thermally treating said chemically treated substrate, or said forming said adhesion-promoting layer comprises exposing said substrate to an oxygen-containing environment, a nitrogen-containing environment, or a carbon-containing environment, or a combination thereof to oxidize, nitridize, or carbidize a surface layer of said substrate;
depositing a capping layer over said sacrificial layer;
patterning said capping layer and said sacrificial layer to create a pattern in said capping layer and said sacrificial layer;
metalizing said pattern formed in said capping layer and said sacrificial layer;
decomposing said sacrificial layer by exposing said substrate to ultraviolet (UV) radiation and heating said substrate; and
removing said decomposed sacrificial layer through said capping layer.

* * * * *